US 8,995,158 B2

(12) United States Patent
Weis et al.

(10) Patent No.: US 8,995,158 B2
(45) Date of Patent: *Mar. 31, 2015

(54) CIRCUIT ARRANGEMENT WITH A RECTIFIER CIRCUIT

(71) Applicant: Infineon Technologies Dresden GmbH, Dresden (DE)

(72) Inventors: Rolf Weis, Dresden (DE); Gerald Deboy, Klagenfurt (AT)

(73) Assignee: Infineon Technologies Dresden GmbH, Dresden (DE)

( * ) Notice: Subject to any disclaimer, the term of this patent is extended or adjusted under 35 U.S.C. 154(b) by 0 days.

This patent is subject to a terminal disclaimer.

(21) Appl. No.: 13/834,700

(22) Filed: Mar. 15, 2013

(65) Prior Publication Data

US 2014/0016361 A1 Jan. 16, 2014

Related U.S. Application Data

(63) Continuation-in-part of application No. 13/546,510, filed on Jul. 11, 2012.

(51) Int. Cl.
*H02M 7/217* (2006.01)
*H03K 17/10* (2006.01)
(Continued)

(52) U.S. Cl.
CPC ............ *H02M 7/217* (2013.01); *H03K 17/102* (2013.01); *H02M 3/1588* (2013.01); *H02M 3/33592* (2013.01); *Y02B 70/1466* (2013.01); *Y02B 70/1475* (2013.01)
USPC .......................................................... 363/127

(58) Field of Classification Search
USPC ............................... 363/52, 53, 125, 126, 127
See application file for complete search history.

(56) References Cited

U.S. PATENT DOCUMENTS

| 4,692,643 A | 9/1987 | Tokunaga et al. |
| 4,751,408 A | 6/1988 | Rambert |

(Continued)

FOREIGN PATENT DOCUMENTS

| DE | 102007046705 B3 | 4/2009 |
| WO | 2012093177 A2 | 7/2012 |

OTHER PUBLICATIONS

Weis, Rolf et al., "Semiconductor Arrangement with Active Drift Zone", Weis, Rolf, et al. "Semiconductor Arrangement with Active Drift Zone." U.S. Appl. No. 13/362,038, filed Jan. 31, 2012.

(Continued)

*Primary Examiner* — Adolf Berhane
(74) *Attorney, Agent, or Firm* — Murphy, Bilak & Homiller, PLLC

(57) ABSTRACT

A rectifier circuit includes first and second load terminals, a first semiconductor device having a load path and configured to receive a drive signal, and a plurality of second semiconductor devices each having a load path and each configured to receive a drive signal. The load paths of the second semiconductor devices are connected in series, and connected in series to the load path of the first semiconductor device. A series circuit with the first semiconductor device and the second semiconductor devices is connected between the load terminals. Each of the second semiconductor devices is configured to receive as a drive voltage either a load-path voltage of at least one of the second semiconductor devices, or a load-path of at least the first semiconductor device. The first semiconductor device is configured to receive as a drive voltage a load-path-voltage of at least one of the second semiconductor devices.

26 Claims, 25 Drawing Sheets

(51) Int. Cl.
*H02M 3/158* (2006.01)
*H02M 3/335* (2006.01)

(56) References Cited

U.S. PATENT DOCUMENTS

| | | | |
|---|---|---|---|
| 5,742,491 A | 4/1998 | Bowman et al. | |
| 6,097,257 A * | 8/2000 | Kadowaki et al. | 331/116 FE |
| 6,798,256 B1 | 9/2004 | Hazucha et al. | |
| 7,158,392 B2 | 1/2007 | Hosokawa et al. | |
| 7,301,388 B2 * | 11/2007 | Kim | 327/536 |
| 8,031,498 B2 | 10/2011 | Deboy et al. | |
| 8,111,104 B2 * | 2/2012 | Ahadian et al. | 330/290 |
| 8,193,559 B2 | 6/2012 | Haeberlen et al. | |
| 8,569,842 B2 * | 10/2013 | Weis et al. | 257/401 |
| 2009/0140707 A1 | 6/2009 | Deboy | |
| 2010/0078694 A1 | 4/2010 | Willmeroth et al. | |
| 2012/0175634 A1 | 7/2012 | Weis | |
| 2012/0175635 A1 | 7/2012 | Weis et al. | |
| 2013/0193525 A1 * | 8/2013 | Weis et al. | 257/379 |
| 2014/0016386 A1 * | 1/2014 | Weis et al. | 363/126 |
| 2014/0062544 A1 * | 3/2014 | Weis et al. | 327/109 |

OTHER PUBLICATIONS

Weis, Rolf, "Semiconductor Arrangement with Active Drift Zone",
Weis, Rolf. "Semiconductor Arrangement with Active Drift Zone."
U.S. Appl. No. 13/362,033, filed Jan. 31, 2012.

* cited by examiner

CIRCUIT ARRANGEMENT WITH A RECTIFIER CIRCUIT

PRIORITY CLAIM

This application is a Continuation-In-Part (CIP) of U.S. patent application Ser. No. 13/546,510, filed on 11 Jul. 2012, the content of said application incorporated herein by reference in its entirety.

TECHNICAL FIELD

Embodiments of the present invention relate to a circuit arrangement with a rectifier.

BACKGROUND

Rectifiers are electronic circuits or electronic devices that allow a current to flow in a first direction, while preventing a current to flow in an opposite second direction. Such rectifiers are widely used in a variety of electronic circuits in automotive, industrial and consumer applications, in particular in power conversion and drive applications.

Conventional rectifiers can be implemented with a diode that conducts a current when forward biased and that blocks when reverse biased. A diode, however, causes relatively high losses when forward biased. These losses are proportional to the current through the diode. In particular in power conversion application or power supply applications in which high current may flow through the rectifier, significant losses may occur. Further, due to reverse recovery effects, a diode (power diode) used in power conversion or drive applications does not immediately block when it changes from the forward biased state to the reverse biased state, so that there may be a time period in which a current flows in the reverse direction.

A rectifier can also be implemented with a MOSFET (power MOSFET) and suitable drive circuit for the MOSFET. A conventional power MOSFET includes an integrated diode, known as body diode, that is effective between a drain terminal and a source terminal of the MOSFET. By virtue of this diode a MOSFET always conducts a current when a voltage is applied between the drain and source terminals that reverse biases the MOSFET. In an n-type MOSFET (p-type MOSFET), a voltage reverse biasing the MOSFET is a positive source-drain voltage (negative source-drain voltage). The drive circuit switches the MOSFET on each time the MOSFET is reverse biased. The losses occurring in a MOSFET in the on-state are lower than losses occurring in a diode under similar operating conditions. However, power MOSFETs, that may be used in rectifiers, in drive applications or an power conversion applications, may have a significant output capacitance that needs to be charged/discharged each time the MOSFET is switched on/off. This capacitance causes switching losses and switching delays.

There is therefore a general need to provide a circuit arrangement with a rectifier circuit having reduced losses.

SUMMARY

A first embodiment relates to a circuit arrangement including a rectifier circuit. The rectifier circuit includes a first and a second load terminal, a first semiconductor device having a load path and a control terminal, and a plurality of second semiconductor devices, each having a load path between a first load terminal and a second load terminal and a control terminal. The second semiconductor devices have their load paths connected in series and connected in series to the load path of the first semiconductor device, and the series circuit with the first semiconductor device and the second semiconductor devices is connected between the load terminals of the rectifier circuit, and one of the second semiconductor devices has its control terminal connected to one of the load terminals of the first semiconductor device, and wherein second semiconductor devices other than the one second semiconductor device each have their control terminal connected to a load terminal of one second semiconductor device.

A second embodiment relates to a rectifier circuit. The rectifier circuit includes a first and a second load terminal, a first semiconductor device having a load path and configured to receive a drive signal, and a plurality of second semiconductor devices each having a load path and each configured to receive a drive signal. The second semiconductor devices have their load paths connected in series and connected in series to the load path of the first semiconductor device, and the series circuit with the first semiconductor device and the second semiconductor devices is connected between the load terminals. Each of the second semiconductor devices is configured to receive as a drive voltage either a load-path voltage of at least one second semiconductor, or a load-path voltage of at least the first semiconductor device, and the first semiconductor device is configured to receive as a drive voltage a load-path-voltage of at least one of the plurality of second semiconductor devices.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

FIG. 7 that includes

FIG. 8 that includes

FIG. 18 that includes

FIG. 21 that includes

FIG. 22 that includes

FIG. 27 that includes

DETAILED DESCRIPTION

In the following detailed description, reference is made to the accompanying drawings, which form a part thereof, and in which is shown by way of illustration specific embodiments in which the invention may be practiced.

Figure 1:
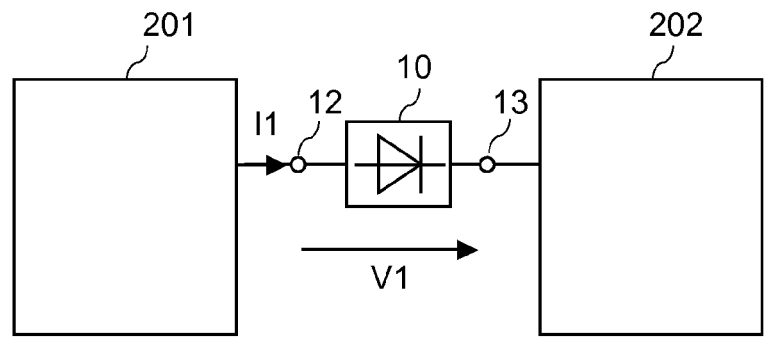
FIG. 1 schematically illustrates a circuit arrangement with a rectifier circuit.

FIG. 1 illustrates a circuit arrangement with a rectifier circuit 10 connected between a first circuit block 201 and a second circuit block 202. Each of the circuit blocks 201, 202 includes at least one of an electronic device, a voltage source, a current source, at least one of a terminal for applying an electrical potential. Some embodiments of the first and second circuit blocks are explained with reference to further figures below.

The rectifier circuit 10 includes a first load terminal coupled to the first circuit block 201 and a second load terminal 202 coupled to the second circuit block 202. The rectifier circuit 10 is configured to conduct a current I1 when a voltage V1 between the first and second load terminals 12, 13 has a first polarity, and is configured to block when the voltage V1 has a second polarity opposite the first polarity and has a magnitude that is lower than a voltage blocking capability of the rectifier circuit 10. The voltage blocking capability defines the maximum voltage that may be blocked by the rectifier circuit 10. Just for illustration purposes it is assumed that the voltage V1 has the first polarity when the voltage V1 is a positive voltage between the first and the second load terminals 12, 13, and that the voltage V1 has the second polarity when the voltage V1 is a negative voltage between the first and the second load terminals 12, 13.

Figure 2:
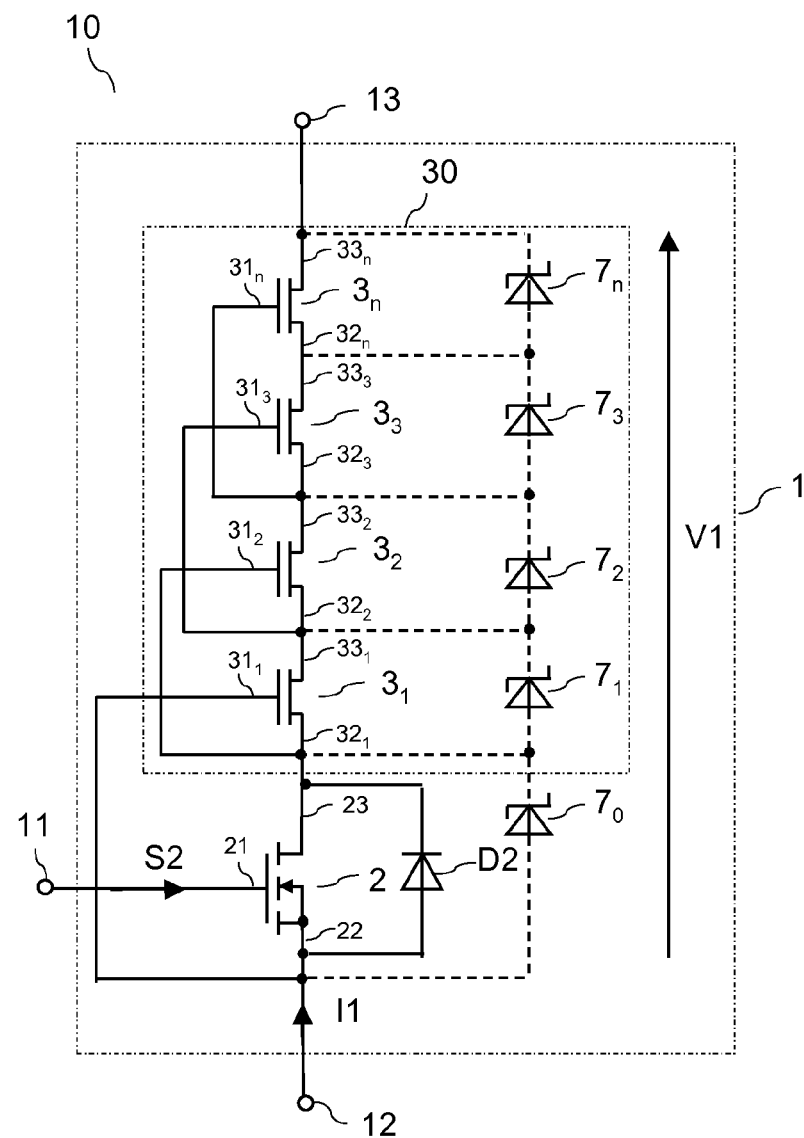
FIG. 2 illustrates a first embodiment of a rectifier circuit including a series circuit with a first semiconductor device and a plurality of second semiconductor devices connected in series.

FIG. 2 illustrates a first embodiment of the rectifier circuit 10. Referring to FIG. 2, the rectifier circuit 10 includes a first semiconductor device 2 and a plurality of second semiconductor devices $3_1$-$3_n$.

The first semiconductor device 2 has a load path between a first load terminal 22 and a second load terminal 23 and a control terminal 21 and can assume one of an on-state, in which the load path conducts a current, and an off-state, in which the load paths blocks. The first semiconductor device 2 according to FIG. 1 is implemented as a transistor device (transistor). Specifically, the first semiconductor device according to FIG. 2 is implemented as a MOSFET where the control terminal 21 is a gate terminal and the first and second 22, 23 load terminals are source and drain terminals, respectively. The first semiconductor device will be referred to as first transistor in the following In FIG. 2 as well as in the following figures reference number "3" followed by a subscript index denotes the individual second semiconductor devices. Same parts of the individual second semiconductor devices, such as control terminals and load terminals, have the same reference character followed by an subscript index. For example, $3_1$ denotes a first one of the second semiconductor devices that has a control terminal $31_1$ and first and second load terminals $32_1$, $33_1$. In the following, when reference is made to an arbitrary one of the second semiconductor devices or to the plurality of the second semiconductor devices, and when no differentiation between individual second semiconductor devices is required, reference numbers 3, 31, 32, 33 without indices will be used to denote the second semiconductor devices and their individual parts.

The second semiconductor devices 3 are implemented as transistor devices (transistors) in the embodiment illustrated in FIG. 5 and will be referred to as second transistors in the following. Each of the second transistors 3 has a control terminal 31 and a load path between a first load terminal 32 and a second load terminal 33. The load paths 32-33 of the second semiconductor devices are connected in series with each other so that the first load terminal of one second transistor is connected to the second load terminal of an adjacent second transistor. Further, the load paths of the second transistors 3 are connected in series with the load path 22-23 of the first semiconductor device 2, so that the first semiconductor device 1 and the plurality of second transistors 3 form a cascode-like circuit.

Figure 3:
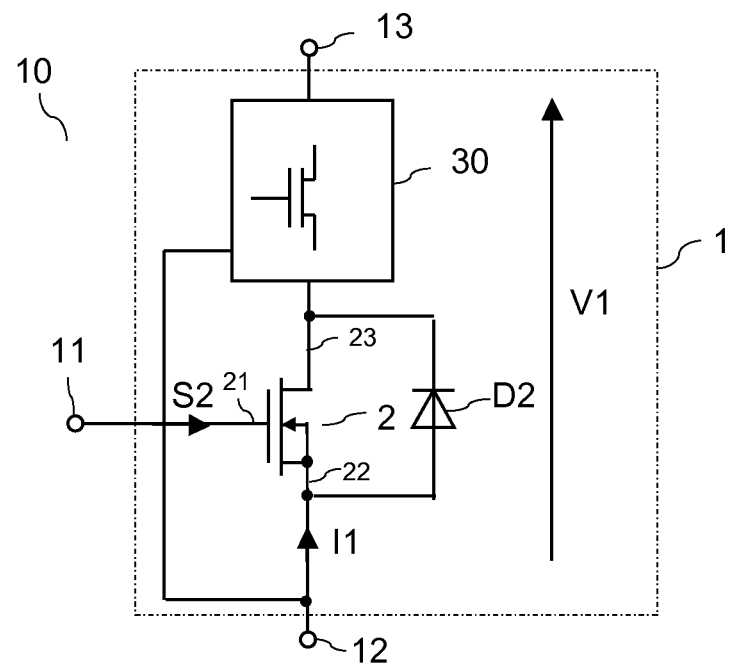
FIG. 3 illustrates a second embodiment of a rectifier circuit including a series circuit with a first semiconductor device and a plurality of second semiconductor devices connected in series.

Referring to FIG. 3, there are n second transistors 3, with n>1 (or n≥2). From these n second transistors 3, a first second transistors $3_1$ is the second transistor that is arranged closest to first semiconductor device 2 in the series circuit with the n second transistors 3 and has its load path $32_1$-$33_1$ directly connected to the load path 22-23 of the first semiconductor device 2. An n-th second transistors $3_n$ is the second transistor that is arranged most distant to first semiconductor device 2 in the series circuit with the n second transistors 3. In the embodiment illustrated in FIG. 5, there are n=4 second transistors 3. However, this is only an example, the number n of second transistors 3 can be selected arbitrarily, namely dependent on a desired voltage blocking capability of the semiconductor device arrangement. This is explained in greater detail herein below.

Each of the second transistors 3 has its control terminal 31 connected to one of the load terminals of another one of the second transistors 3 or to one of the load terminals of the first transistor 2. In the embodiment illustrated in FIG. 1, the 1st second transistor $3_1$ has its control terminal $31_1$ connected to the first load terminal 22 of the first transistor 2. Each of the other second transistors $3_2$-$3_{n-1}$ have their control terminal $31_2$-$31_n$ connected to the first load terminal $32_1$-$32_3$ of the second transistor that is adjacent in the series circuit in the direction of the first semiconductor device 2. Assume, for explanation purposes, that $3_i$ is one of the second transistors $3_2$-$3_n$ other than the 1st second transistor $3_1$. In this case, the control terminal $31_i$ of this second transistor (upper second transistor) $3_i$ is connected to the first load terminal $32_{i-1}$ of an adjacent second transistor (lower second transistor) $3_{i-1}$. The first load terminal $32_{i-1}$ of the lower second transistor $3_{i-1}$ to which the control terminal of the upper second transistor $3_i$ is connected to is not directly connected to one of the load terminals $32_i$, $33_i$ of this upper second transistor $3_i$. According to a further embodiment (not illustrated), a control terminal $31_i$ of one second transistor $3_i$ is not connected to the first load terminal $31_{i-1}$ of that second transistor $3_{i-1}$ that is directly connected to the second transistor $3_i$, but is connected to the load terminal $32_{i-k}$ of a second transistor $3_{i-k}$, with k>1, farther away from the transistor. If, for example, k=2, then the control terminal 31, of the second transistor $3_i$ is connected to the first load terminal $32_{i-2}$ of the second transistor $3_{i-2}$ that is two second transistors away from the second transistor $3_i$ in the direction of the first transistor 2 in the series circuit.

Referring to FIG. 2, the first transistor 2 and the second transistors 3 can be implemented as MOSFETs. Each of these MOSFETs has a gate terminal as a control terminal 21, 31, a source terminal as a first load terminal 22,32, and a drain terminal as a second load terminal 23, 33. MOSFETs are voltage controlled devices that can be controlled by the voltage applied between the gate and source terminals (the control terminal and the first load terminal). Thus, in the arrangement illustrated in FIG. 2, the 1st second transistors $3_1$ is controlled through a voltage that corresponds to the load path voltage of the first transistor 2, and the other second transistors $3_i$ are controlled through the load path voltage of at least one second transistor $3_{i-1}$ or $3_{i-2}$. The "load path" voltage of one MOSFET is the voltage between the first and second load terminal (drain and source terminal) of this MOSFET.

In the embodiment illustrated in FIG. 2, the first transistor 2 is a normally-off (enhancement) transistor, while the second transistors 3 are normally-on (depletion) transistors. However, this is only an example. Each of the first semiconductor device 2 and the second transistors 3 can be implemented as a normally-on transistor or as a normally-off transistor. The individual transistors can be implemented as n-type transistors or as p-type transistors. It is even possible to implement the first transistor 2 as a transistor of a first conduction type (n-type or p-type) and to implement the second transistors as transistors of a second conduction type (p-type or n-type) complementary to the first type.

Implementing the first transistor 2 and the second transistors 3 as MOSFETs is only an example. Any type of transistor can be used to implement the first semiconductor device 2 and the second transistors 3, such as a MOSFET, a MISFET, a MESFET, an IGBT, a JFET, a FINFET, a nanotube device, an HEMT, etc. Independent of the type of device used to implement the first semiconductor device 2 and the second semiconductor devices 3, these devices are connected such that each of the second semiconductor devices 3 is controlled by the load path voltage of at least one other second semiconductor devices 3 or the first semiconductor device 2 in the series circuit.

The semiconductor device arrangement 1 with the first transistor 2, and the second transistors 3 can be switched on and off like a conventional transistor by applying a suitable drive voltage or drive signal S2 to the first semiconductor device 2. The control terminal 21 of the first transistor 2 forms a control terminal 11 of the overall arrangement 1, and the first load terminal 21 of the first transistor 2 and the second load terminal of the n-th second transistor $3_n$ form the first and second load terminals 12, 13, respectively, of the overall arrangement. The drive signal S2 for switching on and off the first transistor 2 and, therefore, the semiconductor device arrangement, can be generated in different ways explained below. When the first transistor 2 is switched on, the semiconductor device arrangement 1 may conduct a current in both directions, namely the first direction and the second direction explained with reference to FIG. 1. However, the drive signal S2 is generated such that it switches on the semiconductor device arrangement 1 only when the voltage V1 between the first and second load terminals 12, 13 has the first polarity. That is, when the voltage V1 is a positive voltage between the first and second load terminals in the embodiment of FIG. 2. Thus, the semiconductor device arrangement 1, acts as a rectifier element in the rectifier circuit 10.

The operating principle of the semiconductor device arrangement 1 is explained in the following. Just for explanation purposes it is assumed that the first transistor 2 is implemented as an n-type enhancement MOSFET, that the second transistors 3 are implemented as n-type depletion MOSFETs or n-type JFETs, and that the individual devices 2, 3 are interconnected as illustrated in FIG. 5. The basic operating principle, however, also applies to semiconductor device arrangements implemented with other types of first and second semiconductor devices.

It is commonly known that depletion MOSFETs or JFETs, that can be used to implement the second transistors 3, are semiconductor devices that are in an on-state when a drive voltage (gate-source voltage) of about zero is applied, while depletion MOSFETs or JFETs are in an off-state when the absolute value of the drive voltage is higher than a pinch-off voltage of the device. The "drive voltage" is the voltage between the gate terminal and the source terminal of the device. In an n-type depletion MOSFET or JFET the pinch-off voltage is a negative voltage, while the pinch-off voltage is a positive voltage in a p-type depletion MOSFET or JFET.

When a voltage is applied between the first and second load terminals 12, 13 and when the first transistor 2 is switched on by applying a suitable drive potential (drive signal) S2 to the control terminal 11, the 1st second transistor $3_1$ is conducting (in an on-state), the absolute value of the voltage across the load path 22-23 of the first transistor 2 is too low so as to pinch-off the 1st second transistor $3_1$. Consequently, the second transistor $3_2$ controlled by the load path voltage of second transistor $3_1$ is also starting to conduct, etc. In other words, the first transistor 2 and each of the second transistors 3 are finally conducting so that the semiconductor arrangement 1 is in an on-state.

The first transistor 1 implemented as a MOSFET may be implemented with an internal diode D2 (that is also illustrated in FIG. 2) known as body diode. The body diode is parallel to the load path of the transistor. In an n-type MOSFET (as illustrated in FIG. 2) an anode terminal of the diode D2 corresponds to the source terminal 22 of the MOSFET, while a cathode terminal corresponds to the drain terminal 23. Thus, a positive source-drain voltage (negative drain-source voltage) of the first transistor 1 forward biases the body diode D2. In a p-type MOSFET a negative source-drain voltage (positive drain-source voltage) forward biases the body diode.

Referring to FIG. 2, the first transistor 1 is connected such that a load path voltage V1 with the first polarity (as illustrated in FIG. 2) forward biases the body diode D2. When the body diode D2 is forward biased, a voltage drop across the body diode D2 switches on the 1st second transistor $3_1$, which again switches on the 2nd second transistor $3_2$, and so on. Thus, when the first transistor 1 is switched off, the semiconductor device arrangement by virtue of the body diode D2 automatically operates as a rectifier element that conducts a current when the load path voltage V2 has the first polarity. When the polarity of the external voltage V1 changes to the second polarity (which is opposite to the polarity illustrated in FIG. 2), the body diode D2 is reverse biased so that the 1st second transistor $3_1$ starts to switch off when the absolute value of the load-path voltage reaches the pinch-off voltage of the 1st second transistor $3_1$.

When the 1st second transistor $3_1$ is switched off, the voltage drop across its load path increases so that the 2nd second transistor $3_2$ is switched off, which in turn switches off the 3rd second transistor, and so on, until each of the second transistors 3 is switched off and the semiconductor device arrangement 1 is finally in a stable off-state. The external voltage V1 with the second polarity applied between the second and first terminals 13 and 12 switches as many 2nd transistors from the on-state to the off-state as required to distribute the external voltage over the first semiconductor device 2 and the second transistors 3. When applying a low external voltage V1 with the second polarity, some second transistor 3 are still in the on-state, while others are in the off-state. The number of second transistors 3 that are in the off-state increases as the external voltage V1 with the second polarity increases. Thus, when a high external voltage V1 with the second polarity is applied, that is in the range of the voltage blocking capability of the overall semiconductor device arrangement 1, the first semiconductor device 1 and each of the second transistors 3 are in the off-state When the semiconductor device arrangement 1 is in an off-state and when the external voltage V1 changes the polarity to the first polarity. As soon as the voltage across the body diode D2 drops to a voltage of about zero, the normally-on 1st second transistors $3_1$ switches on which in turn switches on the 2nd second transistor $3_2$, and so on. This continues until each of the second transistors 3 is again switched on. The body diode D2 conducts as soon as the voltage V1 with the first polarity increases to the forward voltage of the body diode D2. This forward voltage is about 0.7V when the body diode (and the other semiconductor devices) is implemented in silicon.

Although the body diode D2 enables a current flow in the first direction when the load voltage V1 has the first polarity, the first transistor 1 through the drive signal 2 may additionally be switched on when the voltage V1 has the first polarity in order to reduce losses. Losses occurring in the body diode D2 correspond to the product of forward voltage of the diode, which is about 0.7V when the first transistor 1 is implemented in silicon technology, and the current I1. This voltage drop across the body diode D2 may be reduced to below the forward voltage when switching on the first transistor 1. When the first transistor 1 is in the on-state (switched on) the body diode D2 is bypassed. When the first transistor 1 is switched off and the external voltage V1 still has the first polarity, the body diode D2 takes the current and keeps the second transistor 3 switched on until the external voltage changes to the second polarity.

It is desirable to switch off the first transistor 1 before the voltage V1 changes to the second polarity in order to prevent a current flow in the second direction. Embodiments of drive circuits and drive schemes that switch on the first transistor 1 only when the voltage V1 has the first polarity are explained below.

Switching states of the second transistors 3 connected in series with the first transistor 2 are dependent on the switching state of the first transistor 2 and follow the switching state of the first transistor 2 when the voltage V1 has the second polarity. Thus, the second transistors 3 are switched off when the first transistor 2 is switched off and when the voltage V1 has the second polarity. Further, by virtue of the body diode D2 the second transistors 3 are switched on independent of the switching state of the first transistor 1 when the voltage V1 has the first polarity. In this case, switching on the first transistor 1 helps to reduce the losses.

In the following, an "on-state" of the semiconductor device arrangement (rectifier element) 1 is an operation state in which the voltage V1 has the first polarity and in which the first transistor 1 is switched on. An "off-state" is an operation state in which the voltage V1 has the second polarity and the first transistor 1 is switched off. The semiconductor arrangement 1 has a low resistance between the first and second load terminals 12, 13 in the on-state, and has a high resistance between the first and second load terminals 12, 13 in the off-state. In the on-state, an ohmic resistance between the first and second load terminals 12, 13 corresponds to the sum of the on-resistances $R_{ON}$ of the first semiconductor device 2 and the second transistors 3 (where the on-resistance is slightly increased when the first transistor 1 is switched off and the body diode D2 conducts the current). A voltage blocking capability, which is the maximum voltage that can be applied between the first and second load terminals 12, 13 when the semiconductor arrangement is in an off-state before an Avalanche breakthrough sets in, corresponds to the sum of the voltage blocking capabilities of the first transistor 2 and the second transistors 3. The first transistor 1 and the individual second transistors may have relatively low voltage blocking capabilities, such as voltage blocking capabilities of between 3V and 50V. However, dependent on the number n of second transistors 3 a high overall voltage blocking capability of up to several 100V, such as 600V or more, can be obtained.

The voltage blocking capability and the on-resistance of the semiconductor arrangement 1 are defined by the voltage blocking capabilities of the first transistor 2 and the second transistors 3 and by the on-resistances of the first transistor 2 and the second transistors 3, respectively. When significantly more than two second transistors are implemented (n>>2), such as more than 5, more than 10, or even more than 20 second transistors 3 are implemented, the voltage blocking capability and the on-resistance of the semiconductor arrangement 1 are mainly defined by the arrangement 30 with the second transistors 3. The overall semiconductor arrangement 1 can be operated like a conventional power transistor, where in a conventional power transistor, an integrated drift region mainly defines the on-resistance and the voltage blocking capability. Thus, the arrangement 30 with the second transistors 3 has a function that is equivalent to the drift region in a conventional power transistor. The arrangement 30 with the second transistors 30 will, therefore, be referred to as active drift region (ADR) or active drift zone (ADZ). The overall semiconductor device arrangement 1 of FIG. 2 can be referred to as ADZ transistor or ADR transistor (ADZ transistor) or as ADRFET (ADZFET), when the first semiconductor device is implemented as a MOSFET.

When the semiconductor device arrangement 1 is in the off-state, the voltage V1 (with the second polarity) applied between the first and second load terminals 12, 13 is distributed such that a part of this voltage drops across the load path 22-23 of the first transistor 2, while other parts of this voltage drop across the load paths of the second transistors 3. However, there may be cases in which there is no equal distribution of this voltage to the second transistors 3. Instead, those second transistors 3 that are closer to the first semiconductor device 2 may have a higher voltage load than those second transistors 3 that are more distant to the first semiconductor device 2.

In order to more equally distribute the voltage to the second transistors 3, the semiconductor arrangement optionally includes voltage limiting means $7_1$-$7_n$ that are configured to limit or clamp the voltage across the load paths of the second transistors 3. Optionally, a clamping element $7_0$ is also connected in parallel to the load path (between the source and drain terminals) of the first semiconductor device 2. These voltage clamping means $7_0$-$7_n$ can be implemented in many different ways. Just for illustration purposes the clamping means $7_0$-$7_n$ illustrated in FIG. 2 include Zener diodes $7_0$-$7_n$, with each Zener diode $7_0$-$7_n$ being connected in parallel with the load path of one of the second transistors 3 and, optionally, the first transistor 2.

Instead of the Zener diodes $7_0$-$7_n$, tunnel diodes, PIN diodes, avalanche diodes, or the like, may be used as well. According to a further embodiment (not illustrated), the individual clamping elements $7_0$-$7_n$ are implemented as transistors, such as, for example, p-type MOSFETs when the second transistors 3 are n-type MOSFETs. Each of these clamping MOSFETs has its gate terminal connected to its drain terminal, and the load path (the drain-source path) of each MOSFET is connected in parallel with the load path of one second transistor 3.

The individual clamping elements, such as the Zener diodes $7_0$-$7_n$ illustrated in FIG. 2 can be integrated in the same semiconductor body as the first transistor 2 and the second transistors 3. However, these clamping elements could also be implemented as external devices arranged outside the semiconductor body.

As compared to a conventional power transistor with an integrated body diode, the semiconductor device arrangement 1 with the first transistor 2 and the plurality of second transistors 3 has reduced switching losses and switches faster from the off-state to the on-state. In a conventional power transistor, switching losses occur by charging an output capacitance of the transistor at the time of switching on and by discharging the output capacitance at the time of switching off. The output capacitance ($C_{OSS}$) includes an internal drain-source capacitance ($C_{DS}$) and an internal gate-drain capacitance ($C_{GD}$) of the transistor. Losses further occur due to reverse recovery effects in the body diode. When the body diode is forward biased, electrical charges are stored in the body diode. These charges have to be removed when the body diode is reverse biased before the body diode blocks. Storing charges in the body diode and removing charges from the body diode induces losses. These losses increase with the amount of charges stored in the forward biased body diode, where this amount increases as the voltage blocking capability of the power transistor increases.

In the semiconductor device arrangement (ADRFET) 1 the output capacitance of the first transistor 2, that may have a voltage blocking capability of several volts up to several 10V, is lower than the output capacitance of a conventional power transistor, that may have a voltage blocking capability of up to several 100V. Further, less charges are stored in the body diode of the first transistor 2 when the body diode D2 is forward biased. Thus, losses occurring in the first transistor 2 of the ADRFET 1 are lower than losses occurring in a power MOSFET having the same voltage capability of the ADRFET 1. The low output capacitance of the first transistor 2 not only keeps switching losses low, but also results in high switching speeds, which means in fast transitions between the on-state and the off-state of the switch 1, and vice versa.

Gate-source capacitances, gate-drain capacitances and drain source capacitances of the second transistors 3 are also charged and discharged when the switch 1 is switched on and off. However, electrical charges required for charging these capacitances of the second transistors 3 are mainly kept in the arrangement 30 with the second transistors 3, so that these charges do not have to be provided by the drive circuit 20 in each switching process. These charges are provided via the load path of the ADRFET. Further, by virtue of the relatively low voltage blocking capabilities of the second transistors 3, the sum of these capacitances of the second transistors 3 is lower than the corresponding output capacitance of a power transistor having the same voltage blocking capability as the ADRFET 1.

FIG. 3 illustrates a further embodiment for implementing the rectifier element (ADRFET) 1 of the rectifier circuit 10. In the rectifier element 1 of FIG. 3 the first transistor 2 is implemented with a depletion MOSFET, specifically with an n-type depletion MOSFET. Like in the embodiment of FIG. 2, the second transistors 3 of FIG. 3 may be implemented as depletion transistors, specifically as n-type depletion transistors. The arrangement 30 with the second transistor is only schematically illustrated in FIG. 3. The individual second transistors of the arrangement 30 may be interconnected as explained with reference to FIG. 2. The operating principle of the rectifier element 1 of FIG. 3 corresponds to the operating principle of the rectifier element of FIG. 2 with the difference that a negative drive voltage (gate-source voltage) is required to switch off the first transistor 2 of FIG. 3, while the enhancement transistor 2 of FIG. 2 already switches when the gate-source voltage decreases below a positive threshold voltage.

Referring to the explanation above, the first transistor 2 of the rectifier element 1 receives a drive signal S2. According to one embodiment, the drive signal S2 is generated such that it switches the first transistor 2 on when the external voltage V1 has the first polarity and switched the first transistor 2 off when the external voltage has the second polarity. According to one embodiment, the drive signal S2 is an externally generated drive signal or is dependent on such externally generated drive signal. An externally generated drive signal is a drive signal generated by an external circuit and is provided to the rectifier circuit 10. According to a further embodiment, the drive signal S2 is an internally generated drive signal. An internally generated drive signal is a drive signal generated in the rectifier circuit 10.

Figure 4:
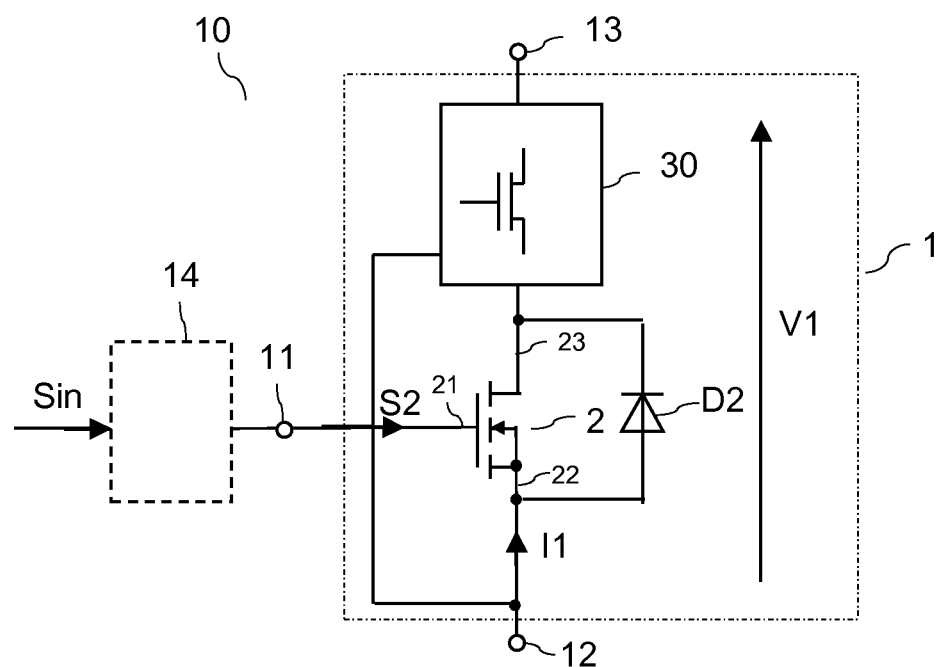
FIG. 4 illustrates a third embodiment of a rectifier circuit including a series circuit with a first semiconductor device and a plurality of second semiconductor devices connected in series.

FIG. 4 schematically illustrates an embodiment of the rectifier circuit 10 that receives an externally generated drive signal Sin. According to one embodiment, the externally generated drive signal Sin is provided to the first transistor 2 as the drive signal S2 of the transistor 2. According to a further embodiment, a drive circuit 14 (illustrated in dashed lines) receives the externally generated drive signal Sin and generates the drive signal S2 of the transistor 2 from the received drive signal Sin. The drive circuit 14 may be configured to adapt signal levels of the received drive signal Sin such that signal levels suitable for driving the first transistor 2 are obtained.

The rectifier element 1 of FIG. 4 corresponds to the rectifier element of FIG. 2. However, this is only an example. The rectifier element 1 could be implemented like any of the rectifier elements explained before.

Figure 5:
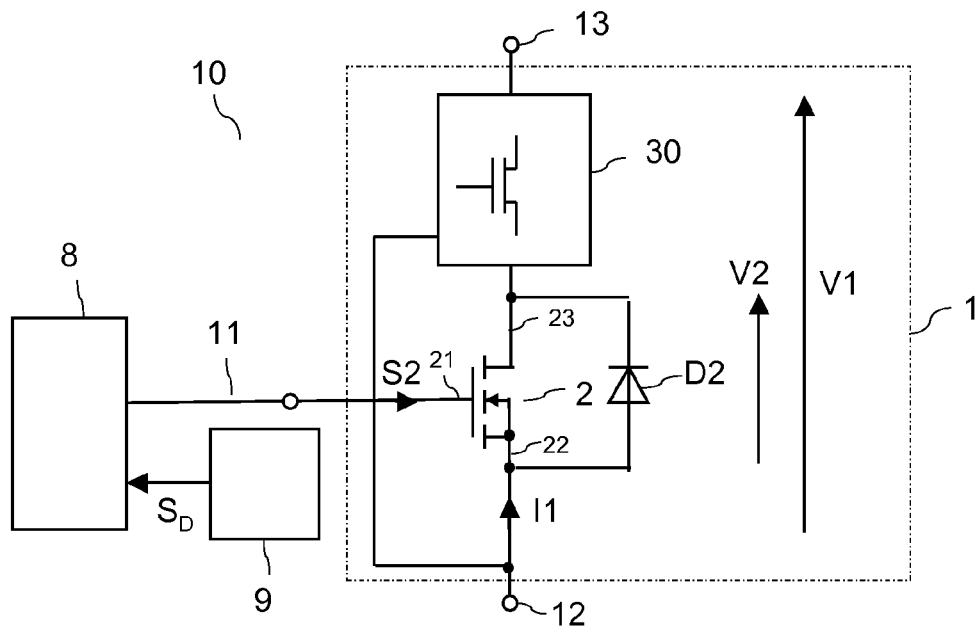
FIG. 5 illustrates an embodiment of a rectifier circuit including a detection circuit and a control drive circuit.

FIG. 5 illustrates an embodiment of a rectifier circuit 10 in which a drive signal S2 of the first transistor 2 is internally generated. Referring to FIG. 5, the rectifier circuit 10 includes a control and drive circuit 8 and a detection circuit 9. The control and drive circuit 8 receives a detection signal $S_D$ from the detection circuit 9 and is configured to generate the drive signal S2 dependent on the detection signal $S_D$. The detection circuit 9 is configured detect (evaluate) an operation parameter of the rectifier circuit. The operation parameter is dependent on at least one of a current through the rectifier element (body diode) D2 in the first semiconductor device 2, a voltage across the rectifier element D2, and a voltage between the first load terminal 12 and the second load terminal 13.

According to one embodiment, the detection circuit 9 provides as the detection signal $S_D$ a current measurement signal representing the current I1. In this case, the detection signal $S_D$ includes an information on the current direction (corresponding to the sign of the detection signal $S_D$) and an information on the magnitude of the current I1. In this embodiment, the control and drive circuit 8 may be configured to switch on the first transistor 2 each time the detection signal $S_D$ indicates that the current I1 flows in the first direction (which in the embodiment of FIG. 5 is the current flow direction illustrated in FIG. 5). The body diode D2 of the first transistor 2 enables a current flow in the first direction 11 before the first transistor 2 is switched on. The first transistor 2 may be switched off when the current I1 falls below a predefined current threshold. A decrease of the current I1 to below the current threshold may indicate that the current I1 is probably about to decrease to zero and that a polarity of the voltage V1 is probably about to change to the second polarity (the polarity opposite to the polarity illustrated in FIG. 5).

According to a further embodiment, the detection circuit 9 provides as the detection signal $S_D$ a current measurement signal representing the current I1 and the control and drive circuit 8 is configured to determine a time variation of the current measurement signal $S_D$. According to one embodiment, the control and drive circuit 8 is configured to switch on the first transistor 2, when the detection circuit $S_D$ indicates that the current I1 flows in the first direction. Further, the control and drive circuit 8 is configured to switch off the first transistor 2 when the current I1 flowing in the first direction decreases and when a slope of the (decreasing) current is higher than a predefined falling slope threshold. This is equivalent to the fact that a (negative) differential coefficient (dI1/dt) of the current I1 has a magnitude higher than the predefined slope threshold. Alternatively, the control and drive circuit 8 switches on the first transistor 2 when the current I1 flows in the first direction and increases and when the slope of the increasing current I1 is above a further slope threshold. This is equivalent to the fact that the positive differential coefficient (dI1/dt) of the current I1 is above the further slope threshold.

According to yet another embodiment, the detection signal $S_D$ represents a voltage V2 across the body diode. The polarity of this voltage V2 corresponds to the polarity of the voltage V1 between the load terminals 12, 13. The body diode voltage V2 has the first polarity when it forward biases the body diode D2 and has the second polarity when it reverse biases the body diode. The body diode D2 starts to conduct, when the voltage V2 has the first polarity and a magnitude corresponding to the forward voltage of the body diode D2 (about 0.7V in silicon). According to one embodiment, the control and drive circuit 8 is operable to switch on the first transistor 1 when the detection signal $S_D$ indicates that the body diode voltage V2 has the first polarity and reaches a first voltage threshold. The first voltage threshold may be below the forward voltage of the body diode D2. In this case the control drive circuit 8 may switch on the first transistor 2 before the body diode conducts. However, due to the propagation delays the body diode voltage may increase to the forward voltage between the time when the body diode voltage V2 reaches the first voltage threshold and the time when the first transistor 1 switches on, so that the body diode D2 is conducting before the first transistor 1 switches on. The control and drive circuit 8 may further be operable to switch off the first transistor 1, when the detection signal indicates that the body diode voltage V2 has the first polarity and falls to a second voltage threshold, such as zero.

According to a further embodiment in which the detection signal $S_D$ represents the body diode voltage V2, the control and drive circuit 8 is operable to switch on the first transistor 1 when the detection signal $S_D$ indicates that the body diode voltage V2 has the first polarity and increases and that a slope of the increasing voltage reaches a predefined first voltage slope threshold. Further, the control and drive circuit 8 is operable to switch off the first transistor 1 when the detection signal $S_D$ indicates that the body diode voltage V2 has the first polarity and decreases and that a slope of the decreasing voltage reaches a predefined second voltage slope threshold. The control and drive circuit 8 may differentiate (calculate a time derivative) of the detection signal $S_D$ in order to obtain the slopes of rising and falling edges of the body diode voltage V2.

Figure 6:
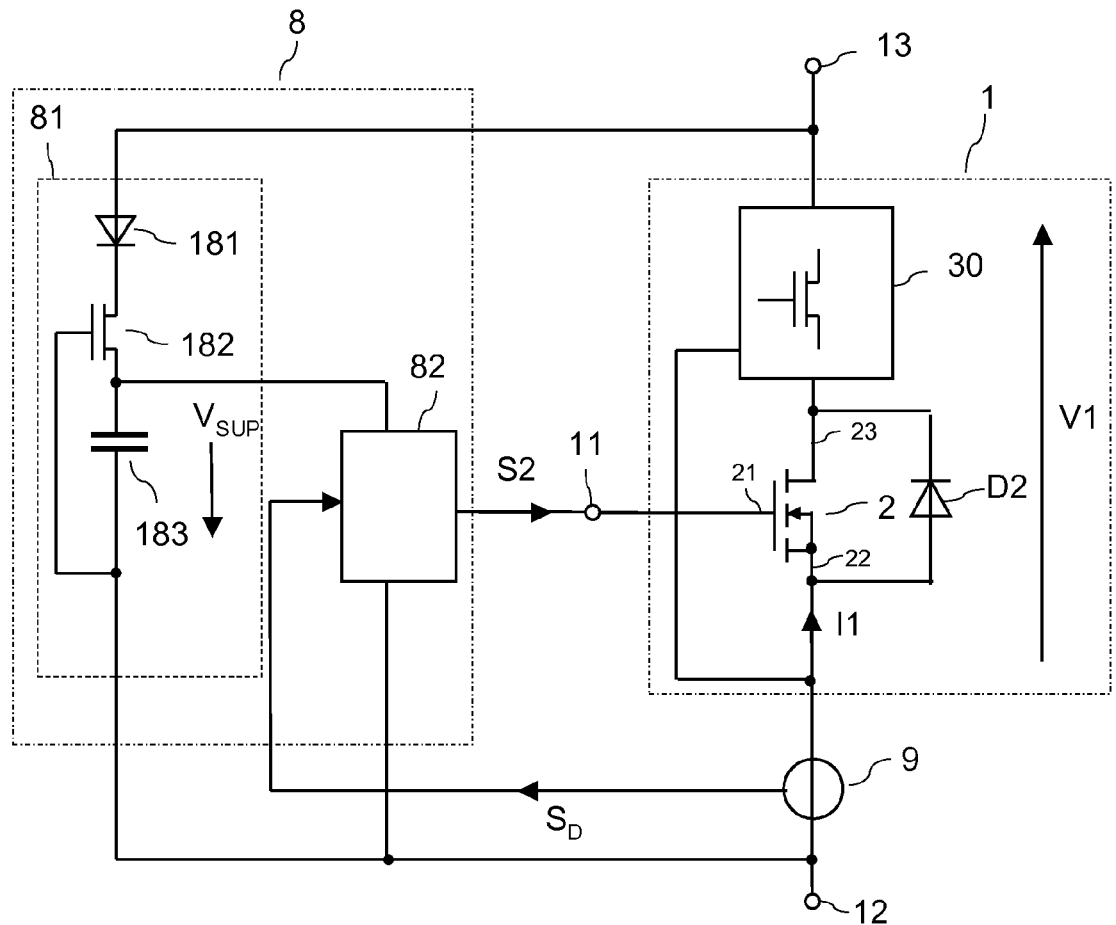
FIG. 6 illustrates the rectifier circuit of FIG. 5 and an embodiment of the control and drive circuit in detail.

FIG. 6 illustrates one embodiment of the control and drive circuit 8 in greater detail. In the embodiment of FIG. 6, the detection circuit 9 is implemented as a current sensor that is configured to measure the current I1 through the rectifier element 1 and that generates a current measurement signal $S_D$ as the detection signal. The control and drive circuit 8 includes a supply circuit 81 configured to provide a supply voltage $V_{SUP}$ and an evaluation and drive circuit 82. The evaluation and drive circuit 82 receives the supply voltage $V_{SUP}$ and the detection circuit $S_D$ and is configured to generate the drive signal S2 from the supply voltage $V_{SUP}$ dependent on the detection signal $S_D$. The evaluation and drive circuit 82 may be configured to evaluate the detection signal $S_D$ as explained in connection with FIG. 5 and to generate the drive signal S2 dependent on the evaluation.

The supply circuit 81 of FIG. 6 includes a capacitive storage element 183, and a rectifier element 181, such as a diode, connected in series with the capacitive storage element 183. The series circuit with the capacitive storage element 183 and the rectifier element 181 is connected between the load terminals 13, 12 of the rectifier element 1. The capacitive storage element 183 is charged each time the voltage V1 across the rectifier element 1 has the second polarity, which is when the first transistor 2 is to be switched off. The rectifier element 181 prevents the capacitive storage element 183 from being discharged when the voltage V1 changes to the first polarity. Optionally, the supply circuit 81 further includes a voltage limiting element that is configured to limit the voltage across the capacitive storage element 183. According to one embodiment, the voltage limiting element 182 is implemented as a depletion MOSFET or a JFET and is connected in series with the capacitive storage element 183. The capacitive storage element 183 is connected between the source terminal and the gate terminal of the depletion MOSFET (JFET). The depletion MOSFET (JFET) pinches off when the voltage across the capacitive storage element 183 equals the pinch-off voltage of the depletion MOSFET (JFET). This pinch-off voltage is selected such that the supply voltage $V_{SUP}$ reaches a predefined voltage, such as, e.g., 15V, 10V, 5V or the like. Implementing the voltage limiting element 182 as a depletion MOSFET or JFET is only an example. Any other type of voltage limiting element may be used as well.

Figure 7A:
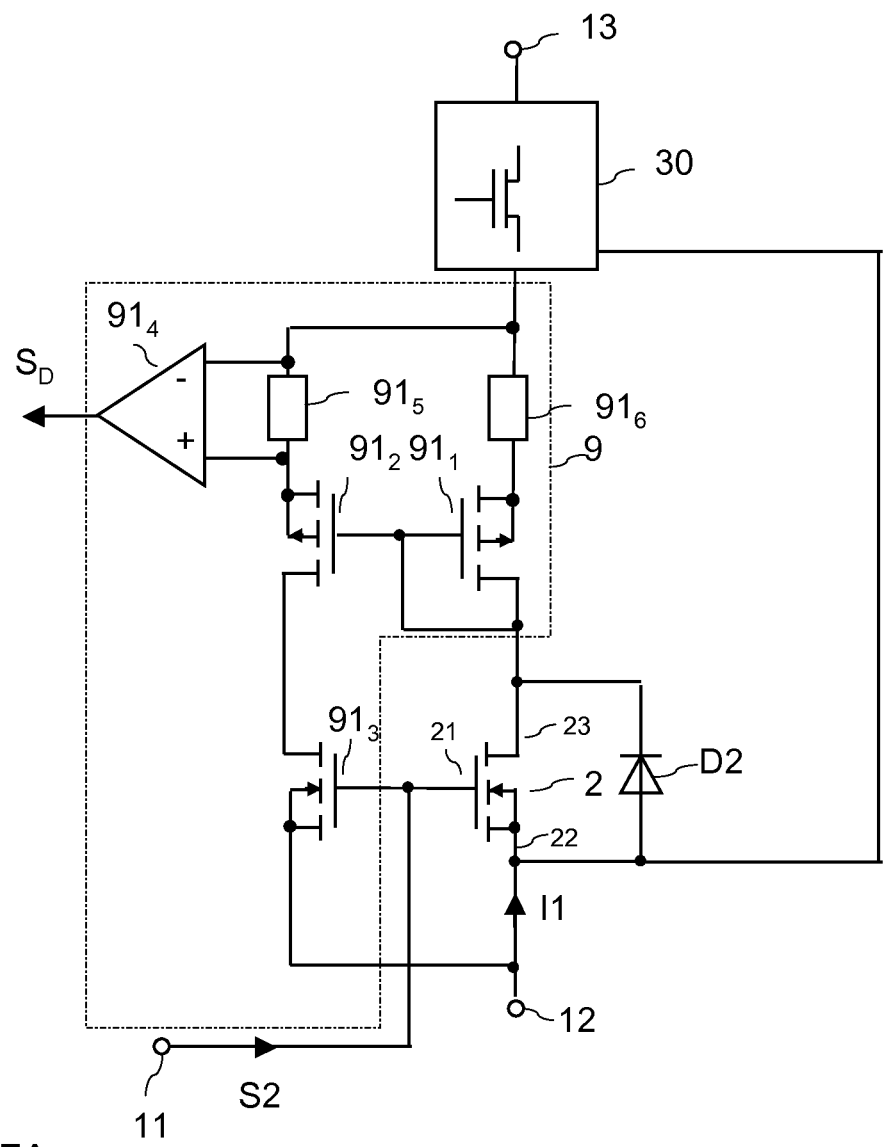
FIGS. 7A and 7B illustrates embodiments of the detection circuit.

FIG. 7A illustrates one embodiment of the current sensor 9 of FIG. 6. Referring to FIG. 7, the current sensor includes a current mirror with a first current mirror transistor $91_1$ and a second current mirror transistor $91_2$. The two current mirror transistors $91_1$, $91_2$ have their control terminals (gate terminals) connected, and a load path (drain-source path) of the first current mirror transistor $91_1$ is connected in series with the load path of the first transistor 2. The first current mirror transistor $91_1$ is connected in series with a first resistor $91_6$, with the series circuit with the first current mirror transistor $91_1$ and the first resistor $91_6$ being connected between the first transistor 2 and the transistor arrangement 30. The first current mirror transistor $91_1$ is connected as a diode and has its control terminal (gate terminal) connected with one of its load terminals (drain terminal). The second current mirror transistor $91_2$ has its load path connected in series with a second resistor $91_5$ and a further transistor $91_3$, with this series circuit being connected between the first load terminal 12 and the transistor arrangement 30.

In the embodiment of FIG. 7, the current mirror transistors $91_1$, $91_2$ are implemented as MOSFETs, in particular as p-type MOSFET, which each have their source terminal coupled to the arrangement 30 with the second transistors, via the first resistor $91_6$ and the second resistor $91_5$, respectively. The further transistor $91_3$ is of the same type as the first transistor 2 and has its load path connected between the first load terminal 12 and the second current mirror transistor $91_2$. The further transistor $91_3$ receives the drive signal S2 and is switched on and off synchronously with the first transistor 2. The further transistor $91_3$ also includes a body diode. However, this body diode is not explicitly illustrated in FIG. 7A.

Referring to FIG. 7A, the detection circuit 9 further includes an amplifier, such as an operation amplifier (OA). The amplifier receives a voltage across the second resistor $91_5$ as an input signal and provides the detection signal $S_D$. The detection signal $S_D$ represents the amplitude of the current I1 through the first transistor 2 (including the body diode D2).

Figure 7B:
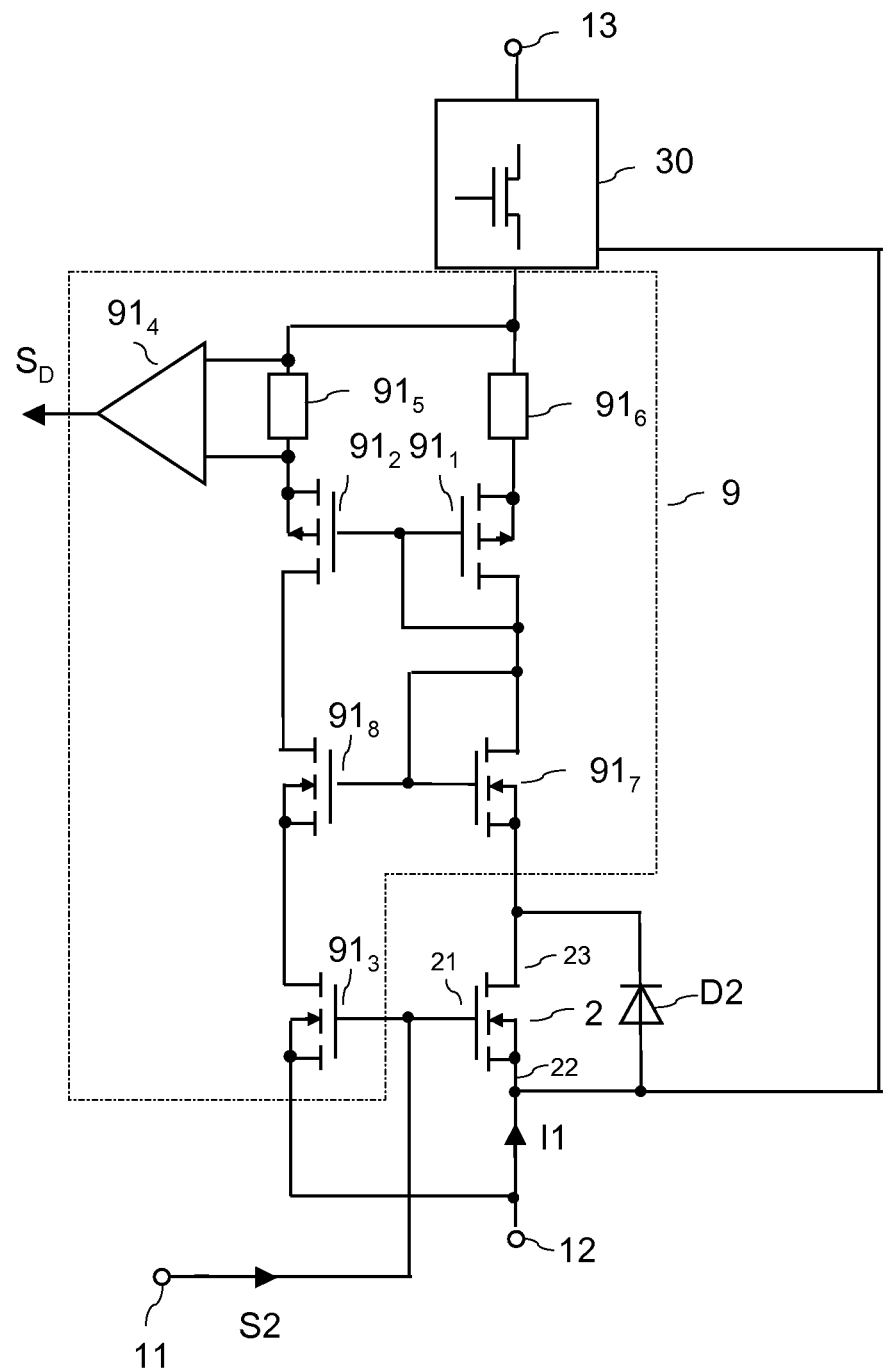

FIG. 7B illustrates a further embodiment of a detection circuit 9. The detection circuit of FIG. 7B is a modification of the detection circuit of FIG. 7A and further includes a second current mirror with a third current mirror transistor $91_7$ connected as a diode and a fourth current mirror transistor $91_8$. These two current mirror transistors $91_7$, $91_8$ have their control terminals (gate terminals) connected together. The second current mirror is connected between the first current mirror and the first transistor 2 and the further transistor $91_3$, where the load path of the third current mirror transistor $91_7$ is connected between the first current mirror transistor $91_1$ and the first transistor 2, and the load path of the fourth current mirror transistor $91_8$ is connected between the second current mirror transistor $91_2$ and the further transistor $91_3$. The detection signal $S_D$ is again available at the output of the amplifier $91_4$. While the detection circuit 9 of FIG. 7A is only capable of measuring the current I1 when the current I1 has the first direction (as indicated in FIG. 7A), the detection circuit 9 of FIG. 7B is capable of measuring the current I1 in both directions.

Figure 8A:
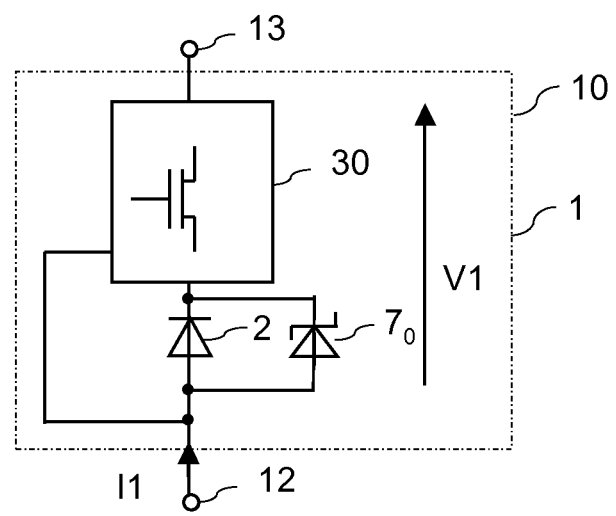
FIGS. 8A and 8B illustrates further embodiments of a rectifier circuit including a series circuit with a first semiconductor device and a plurality of second semiconductor devices connected in series.

FIG. 8A illustrates a further embodiment of the rectifier circuit 10. In this embodiment, the first semiconductor element 2 of the rectifier element 1 is implemented as a diode. The operating principle of this diode 2 corresponds to the operating principle of the body diode D2 of the first transistor in the rectifier elements 1 explained before. The diode 2 of FIG. 8 may be implemented as the body diode of a MOSFET that has its gate terminal connected to its source terminal. That is, a gate terminal of the MOSFET is not connected to a drive circuit or the like.

The operating principle of the rectifier circuit 10 of FIG. 8A corresponds to the operating principle of the rectifier circuit 10 of FIG. 2, when the body diode D2 of the first transistor 2 of FIG. 2 is conducting. The rectifier circuit 10 of FIG. 8 with the first semiconductor element 2 implemented as a diode has higher losses than a rectifier circuit 10 with the first semiconductor device 2 implemented as a transistor. However, the losses of the rectifier element 1 with the diode 2 and the arrangement 30 with the plurality of second transistors has lower losses and switches off faster than a conventional diode having the same voltage blocking capability as the rectifier circuit 10.

Figure 8B:
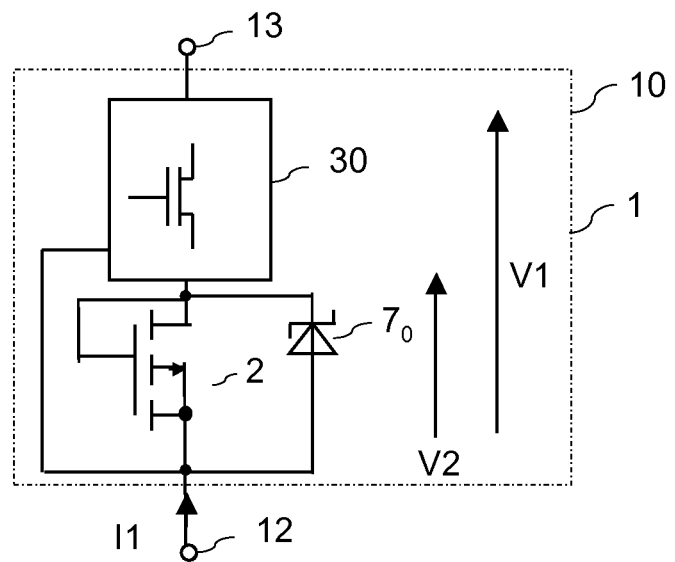

FIG. 8B illustrates another embodiment of a the rectifier circuit. In this embodiment, the first semiconductor device 2 is implemented with a p-type transistor, specifically a p-type MOSFET, This transistor is connected as a diode and has its control terminal (gate terminal) connected with one of its load terminals (drain terminal). In the embodiment of FIG. 8B, the source terminal of the MOSFET is connected to the first load terminal 12, while the drain terminal is connected to the transistor arrangement 30. The transistor arrangement may be implemented as explained with reference to FIG. 2 before. In particular, the transistor arrangement 30 may be implemented with n-type depletion MOSFETs or JFETs.

The rectifier arrangement of FIG. 8B conducts a current I1 in the first direction (the direction indicated in FIG. 8B) when the voltage V1 between the load terminals 12, 13 has the first polarity, so that a voltage V2 across the MOSFET 2, has the first polarity, and when the voltage V2 across the transistor reaches the threshold voltage of the MOSFET 2. According to one embodiment, the MOSFET is implemented with a threshold voltage of about 0V.

The rectifier circuit 10 as explained before may be implemented in a variety of circuit applications, such as industrial, automotive or consumer electronic applications. In particular, the rectifier circuit 10 may be used in power converter circuits operable to generate an output voltage from an input voltage. Embodiments of some power converter circuits including at least one rectifier circuit 10 of the type explained before are explained with reference to drawings below.

Figure 9:
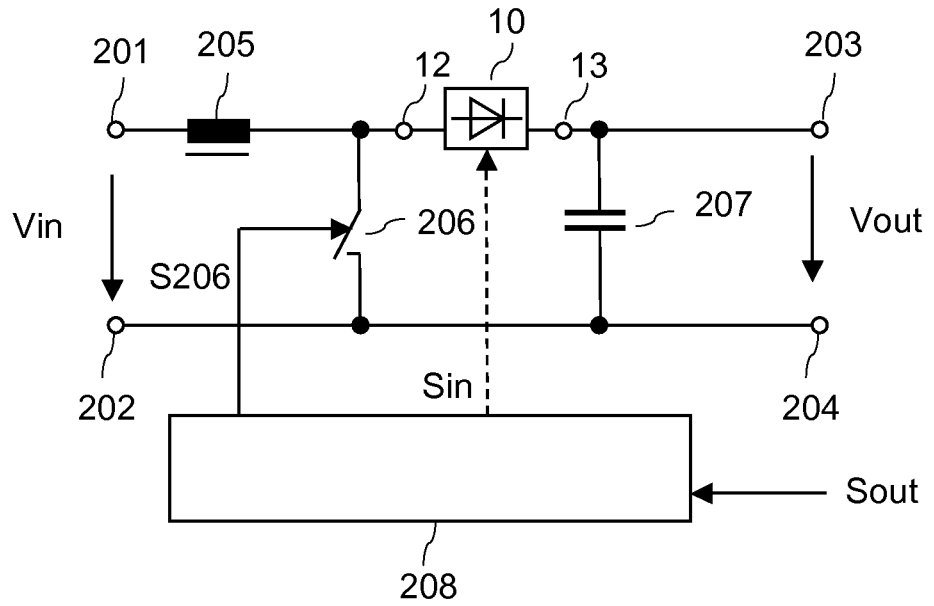
FIG. 9 illustrates a power converter circuit with a boost converter topology.

FIG. 9 illustrates an embodiment of a power converter circuit with a boost converter topology. Referring to FIG. 9, the converter circuit includes input terminals 201, 202 for receiving an input voltage Vin and output terminals 203, 204 for providing an output voltage Vout. An inductive storage element 205, such as a choke, is connected in series with a switch 206. The series circuit with the inductive storage element 205 and the switch 206 is connected between the input terminals 201, 202. A series circuit with a rectifier circuit 10 and a capacitive storage element 207 is connected in parallel with the switch 206, where the output voltage Vout is available across the capacitive storage element 207. The rectifier circuit 10 may be implemented in accordance with one of the embodiments explained before.

Referring to FIG. 9, the power converter circuit further includes a drive circuit 208 that is configured to provide a pulse-width modulated (PWM) drive signal S206 to the switch 206 dependent on an output signal Sout. The output signal Sout is dependent on the output voltage Vout and represents the output voltage Vout. The drive circuit 208 may be implemented like a conventional PWM controller and is configured to adjust a duty-cycle of the drive signal S206 such that the output voltage Vout equals a pre-defined set voltage.

The operating principle of the power converter circuit of FIG. 9 is as follows: Each time the switch 206 is switched on, energy is magnetically stored in the inductive storage element 205. When the switch 206 is switched off, a current I1 through the inductive storage element 205 continuous to flow, where this current flows through the rectifier circuit 10 to the output terminals 203, 204 and the capacitive storage element 207, respectively. The output voltage Vout is a DC voltage. The input voltage Vin may be a DC voltage or an AC voltage. The output voltage Vout is higher than the input voltage Vin or higher than an amplitude of an input voltage Vin.

According to one embodiment, the rectifier circuit 10 is operable to receive an external drive signal Sin. This external drive signal Sin may be provided by the control circuit 208. In this embodiment, the control circuit 208 may be implemented such that it switches on the first transistor in the rectifier circuit 10 each time the switch 206 is switched off, and switches off the first transistor each time the switch 206 is switched or each time the current I1 decreases to zero. However it is also possible to implement the rectifier circuit 10 (and each of the rectifier circuits explained below) such that a drive signal for the first transistor 2 (not illustrated in FIG. 9) is internally generated, as explained with reference to FIGS. 5 and 6, or such that the rectifier circuit 10 is implemented with a diode as the first semiconductor element, as explained with reference to FIG. 8.

Figure 10:
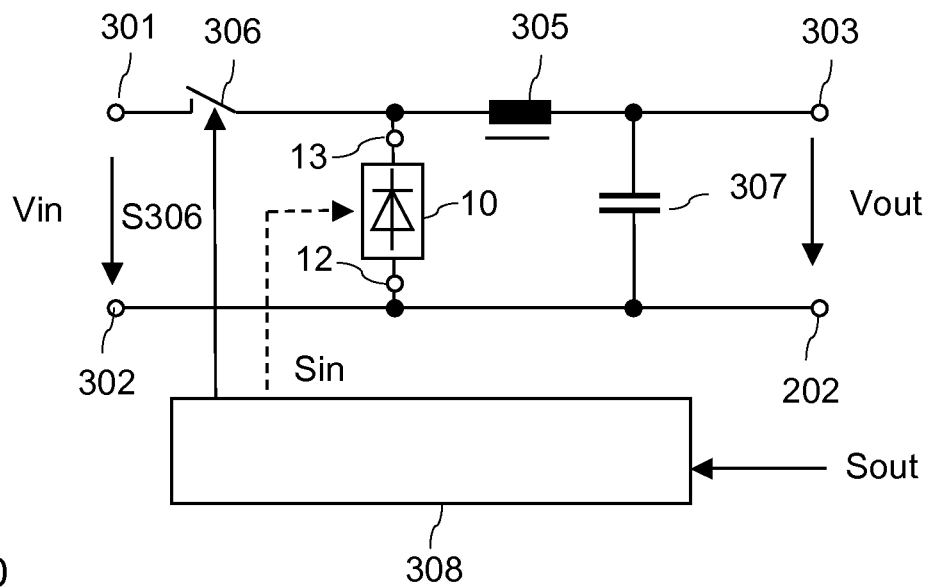
FIG. 10 illustrates a power converter circuit with a buck converter topology.

FIG. 10 illustrates an embodiment of a power converter circuit with a buck converter topology. In this embodiment, a series circuit with a switch 306, an inductive storage element 305 and a capacitive storage element 307 is connected between input terminals 301, 302. The input terminals 301, 302 are operable to receive an input voltage Vin. An output voltage Vout is available between output terminals 303, 304 across the capacitive storage element 307. A rectifier circuit 10 is connected in parallel with the series circuit with the inductive storage element 305 and the capacitive storage element 307. The rectifier circuit 310 may be implemented in accordance with one of the embodiments explained before.

Referring to FIG. 10, a control circuit 308 generates a drive signal S306 for the switch 306. The drive signal is a pulse-width modulated (PWM) drive signal generated by the control circuit 308 dependent on an output signal Sout. The output signal Sout represents the output voltage Vout. The control circuit 308 adjusts the duty-cycle of the drive signal S306 such that the output voltage Vout corresponds to a pre-defined set voltage.

The operating principle of the power converter circuit of FIG. 10 is as follows: Each time the switch 306 is switched on, a current I1 flows driven by the input voltage Vin through the series circuit with the switch 306, the inductive storage element 305 and the capacitive storage element 307. When the switch 306 is switched off, the rectifier circuit 10 acts as a freewheeling element and enables the current I1, driven by the inductive storage element 305, further to flow.

The rectifier circuit 10 may be operable to receive an external drive signal Sin. According to one embodiment, this drive signal Sin is provided by the control circuit 308. In this case, the control circuit 308 is configured such that the switch 306 and the rectifier circuit 10 are not driven in the on-state at the same time. According to one embodiment, the control circuit 308 switches on the transistor in the rectifier circuit 10 each time the switch 306 is switched off. Further, the control circuit 308 is configured to switch off the transistor in the rectifier circuit 10 each time the switch 306 is switched off or each time the current I1 decreases to zero.

Figure 11:
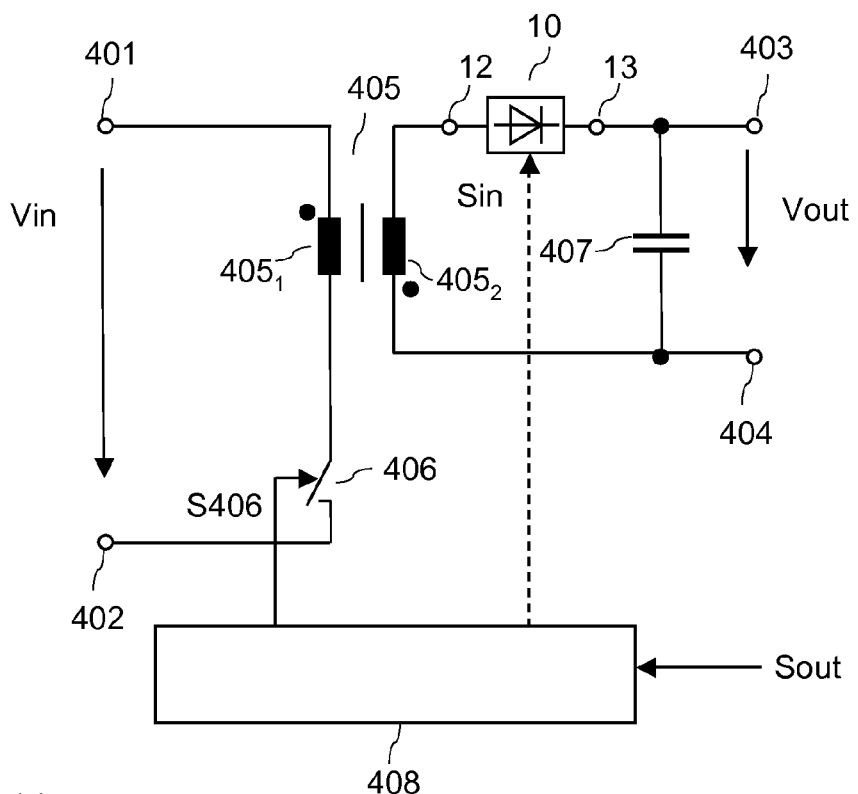
FIG. 11 illustrates a power converter circuit with a flyback converter topology.

FIG. 11 illustrates an embodiment of a power converter circuit including a flyback converter topology. Referring to FIG. 11, the power converter includes a transformer 405 with a primary winding $405_1$ and a secondary winding $405_2$. The primary winding $405_1$ is connected in series with a switch 406, with the series circuit with the primary winding $405_1$ and the switch 406 connected between input terminals 401, 402 for receiving an input voltage Vin. A series circuit with a rectifier circuit 10 and a capacitive storage element 407 is connected in parallel with the secondary winding $405_2$. An output voltage Vout is available across capacitive storage element 407 between output terminals 403, 404.

Referring to FIG. 11, a control circuit 408 generates a drive signal S406 of the switch 406 dependent on an output signal Sout. The output signal Sout is representative of the output voltage Vout. The drive signal S406 is a pulse-width modulated (PWM) drive signal. The control circuit 408 adjusts the duty-cycle of the drive signal S406 such that the output voltage Vout corresponds to a predefined set voltage.

The operating principle of the power converter circuit of FIG. 11 is as follows: Each time the switch 406 is switched on, the primary winding $405_1$ of the transformer 405 is connected between the input terminals 401, 402 and energy is magnetically stored in the primary winding $405_1$. A current I1 through the secondary winding $405_2$ is zero when the switch 406 is switched on, because the primary winding $405_1$ and the secondary winding $405_2$ have opposite winding senses. When the switch 406 is switched of, the primary winding transfers the energy previously stored therein to the secondary winding $405_2$, where a current I1 through the secondary winding $405_2$ flows through the rectifier circuit 10 to the output terminals 403, 404 and the capacitive storage element 407, respectively.

The rectifier circuit 10 may be implemented in accordance with one of the embodiments explained before. The rectifier circuit 10 may be configured to receive an external drive signal Sin. This external drive signal Sin may be generated by the control circuit 408. According to one embodiment, the drive signal Sin is generated such that the transistor in the rectifier circuit 10 is switched on when the switch 406 is switched off. Further, the external drive signal Sin may be generated such that the transistor in the rectifier circuit 10 is switched off, when the current I1 decreases to zero or when the switch 406 is again switched on.

Figure 12:
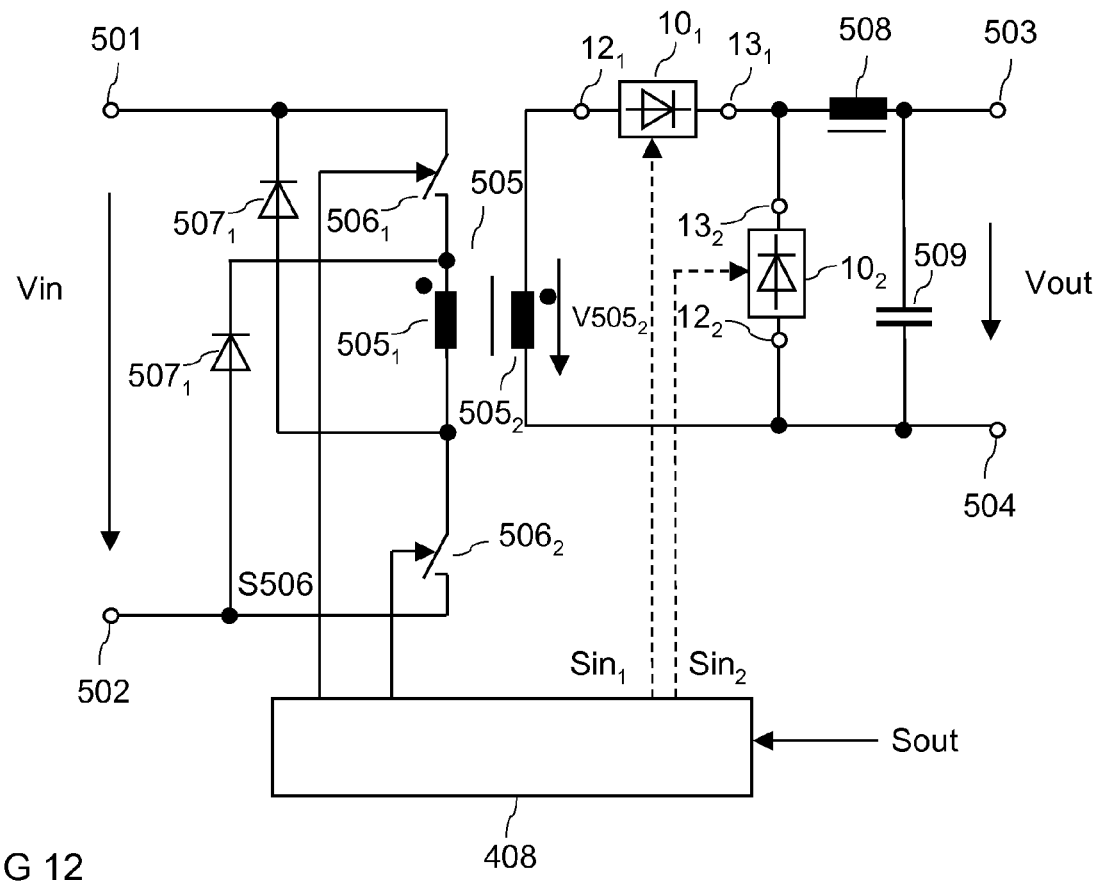
FIG. 12 illustrates a power converter circuit with a two-transistor-forward (TTF) topology.

FIG. 12 illustrates a further embodiment of a power converter circuit. The power converter circuit of FIG. 12 has a two transistor forward (TTF) topology. Referring to FIG. 12, the power converter includes a transformer 505 with a primary winding $505_1$ and a secondary winding $505_2$ that have identical winding senses. The primary winding $505_1$ is connected between a first switch $506_1$ and a second switch $506_2$, with the series circuit with the switches $506_1$, $506_2$ and the primary winding $505_1$ connected between input terminals 501, 502 for receiving an input voltage Vin. A circuit node common to the first switch $506_1$ and the primary winding $505_1$ is coupled to the second input terminal 502 via a first rectifier element $507_1$, such as a diode. Further, a circuit node common to the primary winding $505_1$ and the second switch $506_2$ is coupled to the first input terminal 501 through a further rectifier element $507_2$, such as a diode. A series circuit with a first rectifier circuit $10_1$, an inductive storage element 508, and a capacitive storage element 509 is connected in parallel with the secondary winding $505_2$. An output voltage Vout is available between output terminals 503, 504 across the capacitive storage element 509. A further rectifier circuit $10_2$ is connected in parallel with the series circuit with inductive storage element 508 and a capacitive storage 509.

Referring to FIG. 12, a control circuit 510 generates a drive signal S506 to the first and second switches $506_1$, $506_2$ that are synchronously switched on and switched off. The drive signal S506 is a pulse-width modulated (PWM) drive signal that is dependent on an output signal Sout. This output signal Sout represents the output voltage Vout. The control circuit 510 generates the drive signal S506 with a duty cycle such that the output voltage Vout corresponds to a predefined set voltage.

The operating principle of the power converter circuit of FIG. 12 is as follows: Each time the first and second switches $506_1$, $506_2$ are switched on, the primary winding $505_1$ is connected between the input terminals 501, 502 and a current $I505_1$ flows through the primary winding. The polarity of a voltage $V505_2$ across the secondary winding $505_2$ is as indicated in FIG. 12. This voltage causes a current I1, through the first rectifier circuit $10_1$, the inductive storage element 508 and the capacitive storage element 509. When the switches $506_1$, $506_2$ are switched off, the current $I505_1$ through the primary winding continuous to flow by virtue of the two rectifier elements $507_1$, $507_2$. However, the polarity of the voltage $V505_2$ is inverted, so that the current $I1_1$ through the first rectifier circuit $10_1$ becomes zero and a current $I1_2$ through the second rectifier circuit $10_2$ flows.

The first and second rectifier circuits $10_1$, $10_2$ may be implemented in accordance with one of the embodiments explained before. In particular, the rectifier circuits $10_1$, $10_2$ may be implemented to each receive an external drive signal $Sin_1$, $Sin_2$ (illustrated in dashed lines in FIG. 12), or may be configured to internally generate the drive signals.

Figure 13:
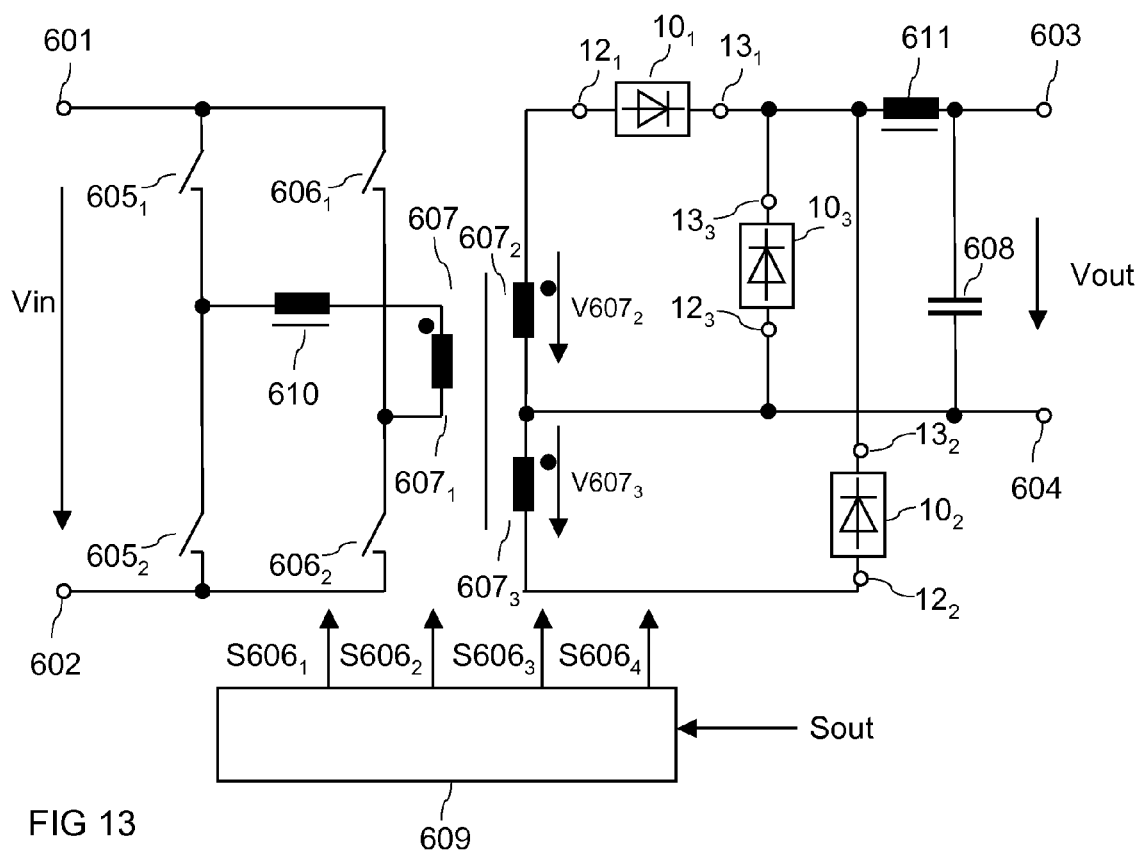
FIG. 13 illustrates a power converter circuit with a phase-shift zero-voltage-switching (ZVS) full-bridge topology.

FIG. 13 illustrates an further embodiment of a power converter circuit. The power converter circuit of FIG. 13 includes a phase-shift zero-voltage switching (ZVS) full bridge topology. Referring to FIG. 13, the power converter circuit includes two half bridges each including a high-side switch $605_1$, $606_1$ and a low-side switch $605_2$, $606_2$ connected between input terminal 601, 602 for receiving an input voltage Vin. A series circuit with an inductive storage element 610 and a primary winding $607_1$ of a transformer 607 is connected between output terminals of the two half bridges. The transformer 607 includes two secondary windings, namely a first secondary winding $607_2$, and a second secondary winding $607_3$ that are inductively coupled with the primary winding $607_1$. The primary winding $607_1$ and the secondary winding $607_2$, $607_3$ have identical winding senses. On the secondary side (the side with the secondary windings), the power converter circuit includes a series circuit with an inductive storage element 611 and a capacitive storage element 608. The first primary winding $607_2$ is coupled to this series circuit 611, 608, through a first rectifier circuit $10_1$, and the second secondary winding $607_3$ is coupled to the series circuit 611, 608 through a second rectifier circuit $10_2$. A third rectifier circuit $10_3$ is connected in parallel with the series circuit with the inductive storage element 611 and the capacitive storage element 608. Specifically, the inductive storage element 611 is connected to the first primary winding $607_2$ through the first rectifier circuit $10_1$ and to the second primary winding $607_3$ through the second rectifier circuit $10_2$. A circuit node common to the first and second secondary winding $607_2$, $607_3$ is connected to that circuit node of the capacitive storage element 608 facing away from the inductive storage element 611 and to the second output terminal 604, respectively.

The switches of the half-bridges are cyclically switched on and off by a drive circuit 609 dependent on an output signal Sout representing the output voltage Vout in accordance with a specific drive scheme. In FIG. 13, reference characters $S605_1$, $S605_2$, $S606_1$, $S606_2$ denote drive signals provided by the drive circuit 609 to the individual switches $605_1$, $605_2$, $606_1$, $606_2$. Each cycle in accordance with this drive scheme includes four different phases. In a first phase, the high-side switch $605_1$ of the first half-bridge and the low-side switch $606_2$ of the second half-bridge are switched on. Thus, a current $I607_1$ flows through the first inductive storage element 610 and the primary winding $607_1$. Voltages $V607_2$, $V607_3$ across the secondary windings $607_2$, $607_3$ have polarities as indicated in FIG. 13. The voltage $V607_2$ causes a current $I1_1$ through the first rectifier circuit $10_1$, the second inductive storage element 611 and the capacitive storage element 608, while the second rectifier circuit $10_2$ blocks.

In a second phase, the high side switch $605_1$ of the first half-bridge is switched on and the high-side switch $606_1$ of the second half-bridge is switched on. There may be a delay time between switching off the low-side switch $605_2$ of the first half-bridge and switching on the high-side switch $606_1$ of the second half-bridge. During this delay time, a freewheeling element (not illustrated) connected in parallel with the high-side switch $606_1$ may take the current. The switches $605_1$, $605_2$, $606_1$, $606_2$ may be implemented as power MOSFETs, in particular as power MOSFETs that include an integrated body diode that may act as freewheeling element.

In the second phase, the voltage across the primary winding $607_1$ and the voltages $V607_2$, $V607_3$ across the secondary windings are zero. The current through the inductive storage element 611 continuous to flow, where the third rectifier circuit $10_3$ takes the current through the inductive storage element 611 and the capacitive storage element 608.

In the third phase, the high-side switch $606_1$ of the second half-bridge and the low-side switch $605_2$ of the first half-bridge are switched on. The voltages $V607_2$, $V607_3$ across the secondary windings $607_2$, $607_3$ have polarities opposite to the polarities indicated in FIG. 13. In this case, a current flows through the second secondary winding $607_3$, the second rectifier circuit $10_2$, the inductive storage element 611 and the capacitive storage element 608.

In the fourth phase, the low-side switch $605_2$ of the first half-bridge is switched off, and the half-side switch $605_1$ of the first half-bridge is switched on. The voltage across the primary winding $607_1$ and the voltage across the secondary windings $607_2$, $607_3$ turn to zero. The current through the second inductive storage element 611 and the capacitive storage element 608 continuous to flow, where the third rectifier circuit $10_3$ provides a current path for this current.

According to one embodiment, a timing of switching on and switching off the individual switches of the two half-bridges is such that at least some of the switches are switched on and/or switched off when the voltage across the respective switch is zero.

Each of the rectifier circuits $10_1$, $10_2$, $10_3$ may be implemented in accordance with one of the embodiments explained before. In FIG. 13, reference characters $12_1$, $12_2$, $12_3$ denote first load terminals and reference characters $13_1$, $13_2$, $13_3$ denote second load terminals of the individual rectifier circuits $10_1$, $10_2$, $10_3$.

Figure 14:
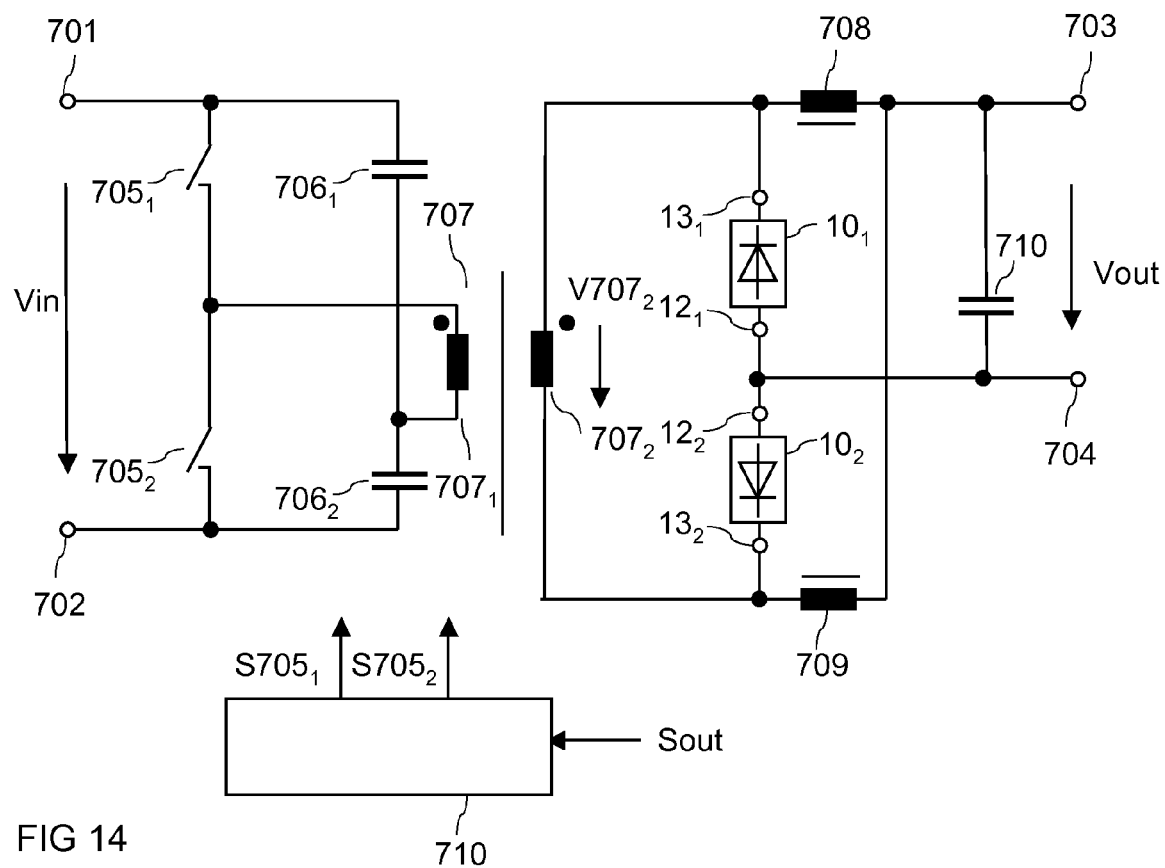
FIG. 14 illustrates a power converter circuit with a hard switching half-bridge topology.

FIG. 14 illustrates a further embodiment of a power converter circuit. The power converter circuit of FIG. 14 is implemented with a hard-switching half-bridge topology. This power converter circuit includes a half-bridge with a high-side switch $705_1$ and a low-side switch $705_2$ connected between input terminals 701, 702 for receiving an input voltage Vin. A capacitive voltage divider $706_1$, $706_2$ is also connected between the input terminals 701, 702. A primary winding $707_1$ of a transformer 707 is connected between an output terminal of the half-bridge and a center tap of the capacitive voltage divider. A secondary winding $707_2$ of the transformer 707 and the primary winding $707_1$ have same winding senses. A first terminal of the secondary winding $707_2$ is connected to a first output terminal 703 through a first inductive storage element 708, and a second terminal of the secondary winding $707_2$ is connected to the first output terminal 703 through a second inductive storage element 709. A capacitive storage element 710 is connected between the first output terminal 703 and a second output terminal 704, where an output voltage Vout is available between these output terminals 703, 704. The second output terminal 704 is connected to the first terminal of the secondary winding $707_2$ through a first rectifier circuit $10_1$, and the second output terminal 704 is connected to the second terminal of the secondary winding $707_2$ through a second rectifier circuit $10_2$. The first rectifier circuit $10_1$ provides a freewheeling path for a first series circuit with the first inductive storage element 708 and the capacitive storage element 710, and the second rectifier circuit $10_2$ provides a freewheeling path for a second series circuit with the second inductive storage element 709 and the capacitive storage element 710.

Each of the first and second rectifier circuit $10_1$, $10_2$ may be implemented in accordance with one of the embodiments explained herein before. In FIG. 14, reference characters $12_1$, $12_2$ denote first load terminals and reference characters $13_1$, $13_2$ denote second load terminals of the individual rectifier circuits $10_1$, $10_2$.

A drive circuit 610 provides drive signals $S705_1$, $S705_2$ for the switches $705_1$, $705_2$ of the half-bridge dependent on an output signal Sout. The output signal Sout represents the output voltage Vout. The drive signals $S705_1$, $S705_2$ are generated such that the output voltage Vout corresponds to a predefined set value.

The operating principle of the power converter circuit of FIG. 14 is as follows: The electrical potential at the center tap of the capacitive voltage divider $706_1$, $706_2$ is somewhere between electrical potentials at the first and second input terminals 701, 702. Just for explanation purposes it is assumed that the electrical potential at the center tap corresponds to half the input voltage Vin.

Each time the high-side switch $705_1$ of the half-bridge is switched on, a voltage across the primary winding $707_1$ is positive and a resulting voltage $V707_2$ across the secondary winding $707_2$ has the polarity as indicated in FIG. 14. In this case, a current flows through the first inductive storage element 708, the capacitive storage element 707, the second rectifier circuit $10_2$ and the secondary winding $707_2$. During this phase, energy is magnetically stored in the first inductive storage element 708.

In a second phase, both switches are switched off. In this phase, the current through the first inductive 708 continuous to flow, where the first rectifier circuit $10_1$ connected between the second output terminal 704 and the first inductive storage element 708 takes the current.

In a third phase, low side switch $705_2$ of the half-bridge is switched on. A voltage across the primary winding $707_1$ is negative in this case, and the corresponding voltage $V707_2$ across the secondary winding $707_2$ has a polarity opposite to the polarity indicated in FIG. 14. In this case, the current flows through the secondary winding $707_2$, the second inductive storage element 709, the output capacitance 710 and the first rectifier circuit $10_1$.

In a fourth phase, both switches $705_1$, $705_2$ are switched off. In this phase, the current through the second inductive storage element 709 continuous to flow, where the second rectifier circuit $10_2$ takes the current in this case.

Figure 15:
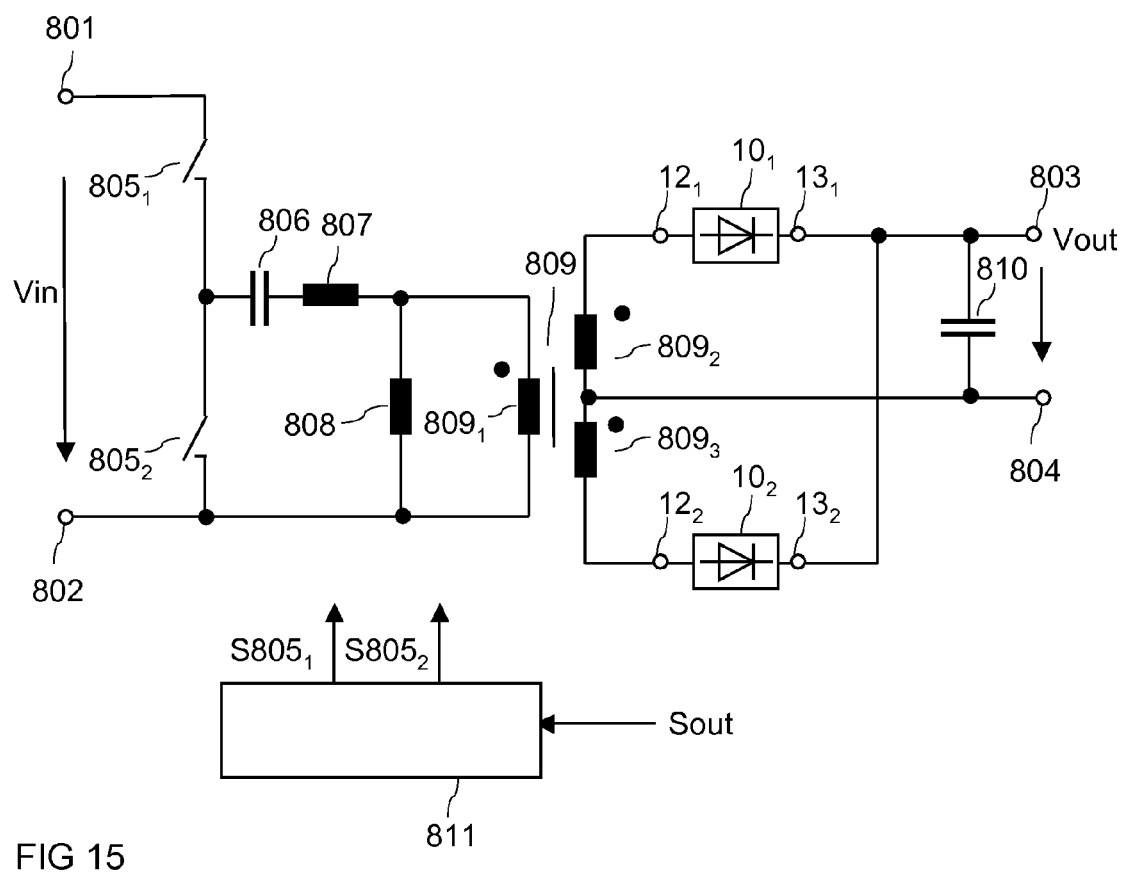
FIG. 15 illustrates a power converter circuit with an LLC resonant DC/DC converter topology.

FIG. 15 illustrates a power converter circuit according to a further embodiment. The power converter circuit of FIG. 15 includes an LLC resonant topology. Referring to FIG. 15, the power converter circuit includes a half-bridge with a high-side switch $805_1$ and a low-side switch $805_2$ connected between the input terminals 801, 802 for receiving an input voltage Vin. The power converter circuit further includes a series LLC circuit with a capacitive storage element 806, an inductive storage element 807, and a primary winding $809_1$ of a transformer 809 connected in parallel with the low-side switch $805_2$. A further inductive storage element 808 is connected in parallel with the primary winding $809_1$. The transformer 809 includes two primary secondary windings, namely a first secondary winding $809_2$ and a second secondary winding $809_3$ coupled to the primary winding $809_1$ and each having same winding sense as the primary winding $809_1$. The first secondary winding $809_2$ is coupled to a first output terminal 803 through a first rectifier circuit $10_1$, and the second primary winding $809_3$ is coupled to the first output terminal 803 through the second rectifier circuit $10_2$. A circuit node common to the first and second secondary windings $809_2$, $809_3$ is coupled to a second output terminal 804. A capacitive storage element 810 is connected between the output terminals 803, 804, where an output voltage Vout is available between the output terminals 803, 804.

In FIG. 15, $S805_1$, $S805_2$ denotes drive signals for the switches $805_1$, $805_2$ of the half-bridge. These drive signals $S805_1$, $S805_2$ are generated by a drive circuit 811 in accordance with an output signal Sout. The output signal Sout represents the output voltage Vout. The drive circuit 8 is configured to generate the drive signals $S805_1$, $S805_2$ such that the output voltage Vout corresponds to a predefined set value.

In the power converter circuit of FIG. 15, the high-side switch $805_1$ and the low-side switch $805_2$ are switched on and off alternatingly. This causes an alternating current through the primary winding $809_1$ of the transformer 809. This alternating current is transferred to the secondary side. When the alternating current through the primary winding $809_1$ has a first direction, a current on the secondary side flows through the first primary winding $809_2$ and the first rectifier circuit $10_1$ to the capacitive storage element 810 and the output terminals 803, 804 respectively. When the current through the primary winding $809_1$, has an opposite second direction, the current on the secondary side flows through the second secondary winding $809_3$ and the second rectifier circuit $10_2$ to the capacitive storage element 810 and the output terminals 803, 804, respectively.

In FIG. 15, reference characters $12_1$, $12_2$ denote first load terminals of the first and second rectifier circuits $10_1$, 10, and reference characters $13_1$, $13_2$ denote second load terminals of the first and second rectifier circuits $10_1$, $10_2$. Each of these rectifier circuits $10_1$, $10_2$ may be implemented in accordance with one of the embodiments explained herein before.

In each of the power converter circuits explained before, a load (not illustrated) may be connected to the output terminals to receive the output voltage Vout.

In case one of the power converter circuits explained before, includes more than one rectifier circuit, the individual rectifier circuits may be implemented identically. However, it is also possible to implement two or more rectifier circuits in one power converter circuit with different topologies.

Figure 16:
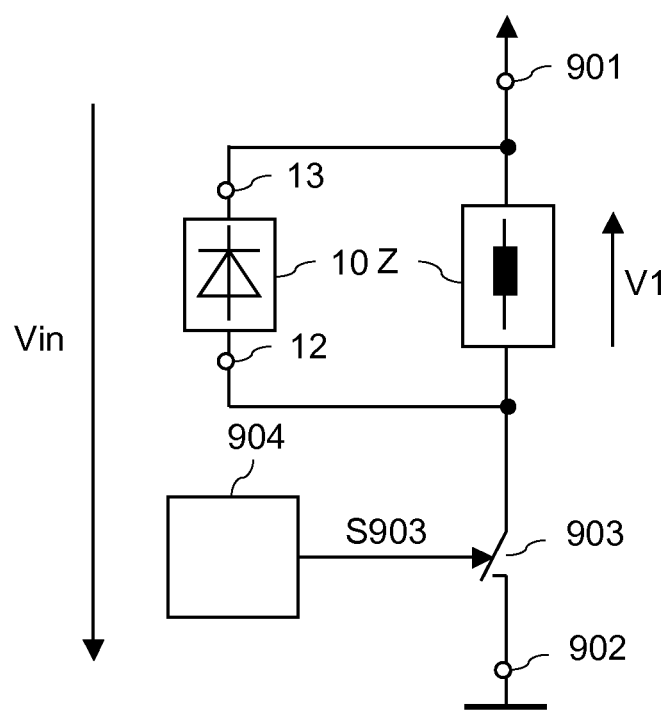
FIG. 16 illustrates a circuit arrangement with a switch and a rectifier circuit according to a further embodiment.

FIG. 16 illustrates a further embodiment of a circuit arrangement including a rectifier circuit 10. The circuit arrangement includes input terminals 901, 902 for receiving an input voltage Vin, a series circuit with a load Z and a switch 903 connected between the input terminals 901, 902 and a rectifier circuit 10 connected in parallel with the load Z. The load Z is, e.g., an inductive load. That is, the load Z includes at least one inductive element or a circuit element with an inductive behavior. The switch 903 is a low-side switch. That is, the switch 903 is connected between the load Z and the terminal for the negative supply potential or reference potential of the input voltage Vin. A circuit configuration as illustrated in FIG. 16 may, e.g. be implemented in a current controller for controlling a current through an inductive load.

The operating principle of the circuit arrangement of FIG. 16 is as follows: Each time the switch 903 is switched on, the load Z is connected between the input terminals 901, 902 and a current I1 flows through the load Z. When the switch 903 is switched off, the current I1 through the load Z by virtue of the inductive character of the load continues to flow (and decreases). In this phase, the rectifier circuit 10 acts as a freewheeling element and takes the current I1 flowing through the load Z.

The switch 903 is switched on and off by a drive signal S903 provided by a control circuit 904. According to one embodiment, the control circuit 904 is configured to adjust a duty-cycle of the drive signal S903 dependent on the voltage I1 through the load Z in order to control an average value of the current I1 through the load to correspond to a predefined set value.

Figure 17:
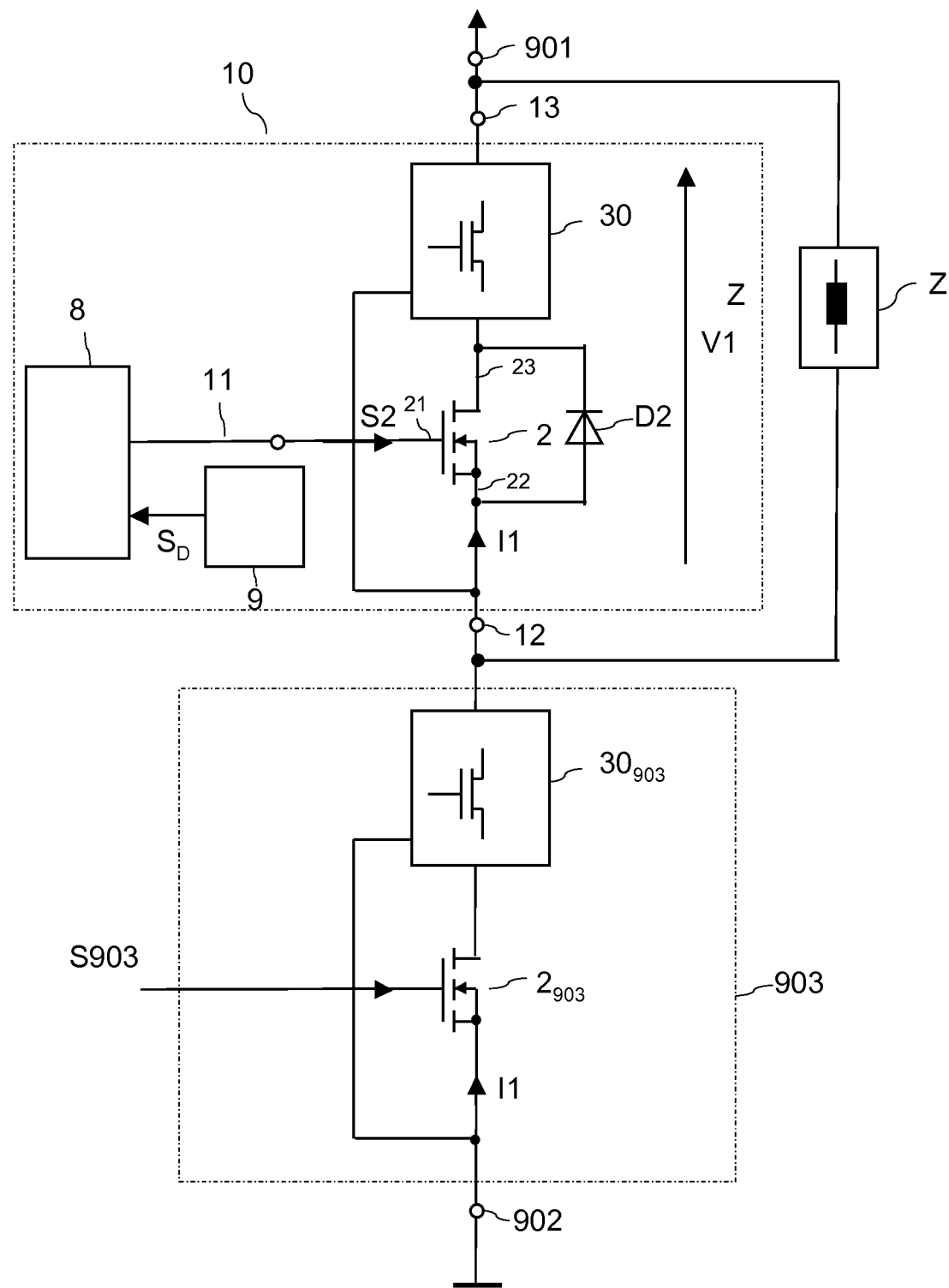
FIG. 17 illustrates embodiments of the switch and the rectifier circuit of FIG. 16.

FIG. 17 illustrates the circuit arrangement of FIG. 16 that includes a rectifier circuit in accordance with the embodiment of FIG. 5. The switch 903 is implemented similar to the rectifier element 1 of the rectifier circuit 10 with a first transistor $2_{903}$ and with an arrangement $30_{903}$ with a plurality of second transistors. In the embodiment of FIG. 17, first transistor $20_{903}$ of the switch 903 is implemented as an n-type enhancement MOSFET. However, this is only an example. The switch 903 could be implemented with any other type of first transistor as well. The arrangement $30_{903}$ with the second transistors may be implemented like the arrangement 30 with the second transistors $3_1$-$3_n$ explained in connection with the rectifier element 1 in FIG. 2 before. The operating principle of the switch 903 corresponds to the operating principle of the rectifier element of FIG. 2. That is, the switch 1 is in the on-state (switched on) when the first transistor $2_{903}$ is switched on, and the switch 903 is in the off-state (switched off) when the first transistor $2_{903}$ is switched off. The drive signal S903 received from the control circuit (not illustrated in FIG. 17) is configured to one of switch on and switch off the first transistor $2_{903}$.

Figure 18A:
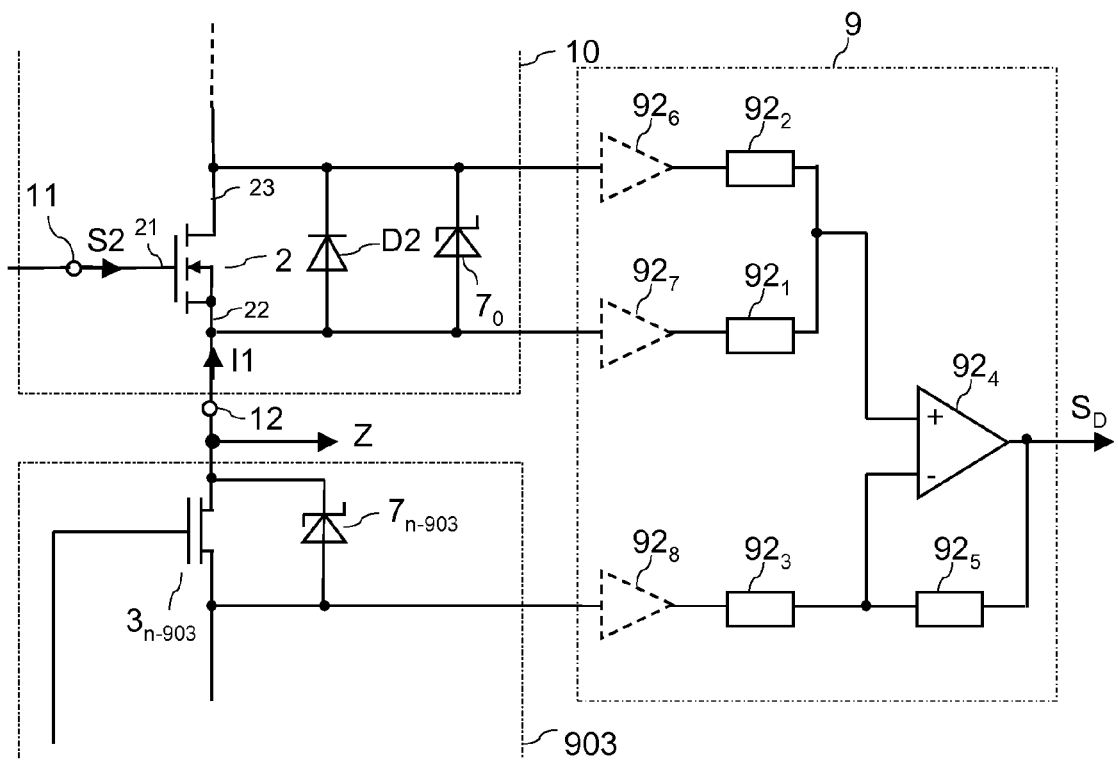
FIGS. 18A and 18B illustrates further embodiments of the detection circuit.

FIG. 18A illustrates one embodiment of a detection circuit 9 of the rectifier circuit 10 in the circuit arrangement of FIG. 17. In FIG. 18, only some of the circuit elements of the rectifier element 1 of the rectifier circuit 10 and only some of the circuit elements of the switch 903 are illustrated, namely those circuit elements necessary for understanding the operating principle of the detection circuit 9. FIG. 18 shows the first transistor 2, the body diode D2 and the optional voltage limiting element $7_0$ of the rectifier element 1 and an n-th second transistor $3_{n\text{-}903}$ of the switch 903. The function of this second transistor $3_{n\text{-}903}$ corresponds to the function of the second transistor $3_n$ illustrated in FIG. 2. Reference character $7_{n\text{-}903}$ denotes the optional voltage limiting element connected in parallel with this second transistor $3_{n\text{-}903}$.

Referring to FIG. 18A, the detection circuit 9 includes an amplifier $92_4$, such as an operational amplifier (OA). This amplifier $92_4$ is operable to evaluate a voltage across the body diode D2 of the first transistor 2 of the rectifier element 1 in order to determine a current I1 through the rectifier element 1. A first load terminal 22 (corresponding to the anode terminal of the body diode D2) of the first transistor 2 is coupled to a first terminal of the operational amplifier $92_4$ through a first resistive element $92_1$, and the second load terminal 23 of the second transistor 2 is coupled to the first terminal of the amplifier $92_4$ through a second resistive element $92_2$. Further, that load terminal of the second transistor $3_{n\text{-}903}$ facing away from the first transistor 2 is coupled to a second terminal of the amplifier $92_4$ through a third resistive element $92_3$. The second terminal of the amplifier $92_4$ is coupled to the output terminal through a further resistive element $92_5$. The detection signal $S_D$ is available at the output of the amplifier $92_4$. Optionally, buffers $92_6$, $92_7$, $92_8$ are connected between the first, second and third resistive elements and the corresponding circuit nodes of the rectifier element 1 and the switch 903. The output signal $S_D$ of the amplifier $92_4$ represents the direction of the current I1, where the output signal $S_D$ has a first sign when the current flows in the first direction and has a second sign when the current flows in the opposite second direction.

Figure 18B:
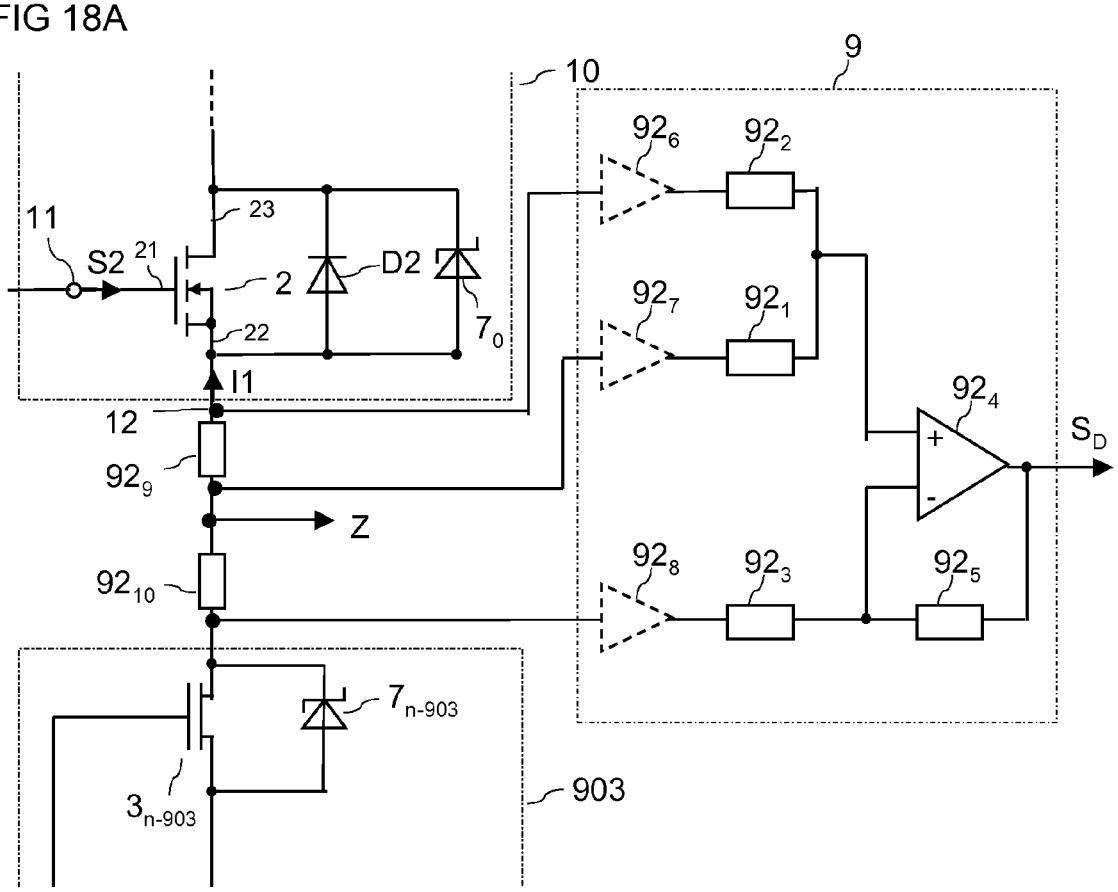

FIG. 18B illustrates a modification of the detection circuit 9 of FIG. 18A. The detection circuit 9 of FIG. 18B includes two shunt resistors, a first shunt resistor $92_9$ between the first load terminal 12 of the rectifier circuit 10 and the circuit node for connecting the load Z thereto, and a second shunt resistor $92_9$ between the circuit node for connecting the load Z thereto and the switch 903. In this detection circuit 9, the first input terminal (the non-inverting terminal) of the amplifier $92_4$ is coupled to the circuit node common to the first shunt resistor $92_9$ and the rectifier circuit via the second resistor $92_9$ and to the circuit node common to the first shunt resistor $92_9$ and the second shunt resistor $92_{10}$ via the first resistor $92_{10}$. Like in the embodiment of FIG. 18A, the buffers $92_6$, $92_7$ are optional. The second input terminal (the inverting terminal) of the amplifier $92_4$ is coupled to the circuit node common to the second shunt resistor $92_{10}$ and the switch 903. In this detection circuit 9, the detection signal $S_D$ at the output of the amplifier $92_4$ represents the direction of the current I1 through the rectifier circuit 10 and the amplitude of the current I1.

Figure 19:
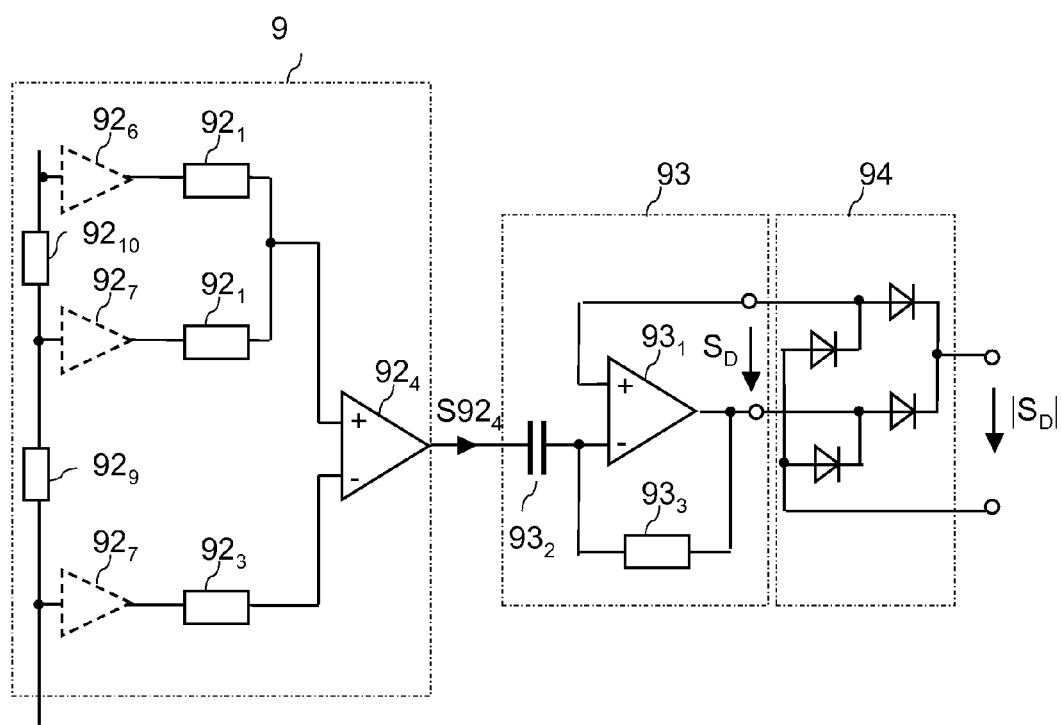
FIG. 19 illustrates yet another embodiment of the detection circuit.

FIG. 19 illustrates a further embodiment of a detection circuit 9. The detection circuit 9 of FIG. 19 is based on the detection circuit 9 of FIG. 18B and further includes a differentiator 93 receiving the current measurement signal at the output of the amplifier $92_4$. In FIG. 19, reference character $S92_4$ denotes the output signal of the amplifier that corresponds to the detection signal of FIG. 18. The differentiator 93 may be implemented like a conventional differentiator. Just for illustration purposes one embodiment of the differentiator 93 is illustrated in detail in FIG. 19.

The differentiator 93 of FIG. 19 includes a further amplifier $93_1$, such as an operational amplifier (OA). The output of the amplifier $92_4$ is coupled to a first input (the inverting input in this embodiment) of the further amplifier $93_1$ through a capacitive element $93_2$. Further, the inverting input is coupled to the output through a resistor $93_3$. A detection signal $S_D$ at the output of the differentiator 93 corresponds to a voltage between the output of the further amplifier $93_1$ and the second input terminal (the non-inverting input terminal in this embodiment) of the further amplifier $93_1$. This output signal corresponds to a time derivative of the current measurement signal $S92_4$ at the output of the amplifier $92_4$. The time derivative of the current measurement signal $S92_4$ is positive when the current I1 through the rectifier circuit 1 increases, and is negative when the current through the rectifier circuit decreases.

The control and drive circuit 8 (not illustrated in FIG. 19) receiving the detection signal $S_D$ of FIG. 19 may be configured to detect maxima of the detection signal $S_D$ and may be configured to switch on the first transistor 2 of the rectifier circuit 1 when the detection signal $S_D$ has a positive maximum, and may be configured to switch off the first transistor 2 of the rectifier circuit 1 when the detection signal $S_D$ has a negative maximum.

Optionally, a rectifier 94 is connected downstream the output the further amplifier $93_1$. The rectifier 94 receives the detection signal $S_D$ and provides a rectified detection signal $|S_D|$.

Figure 20:
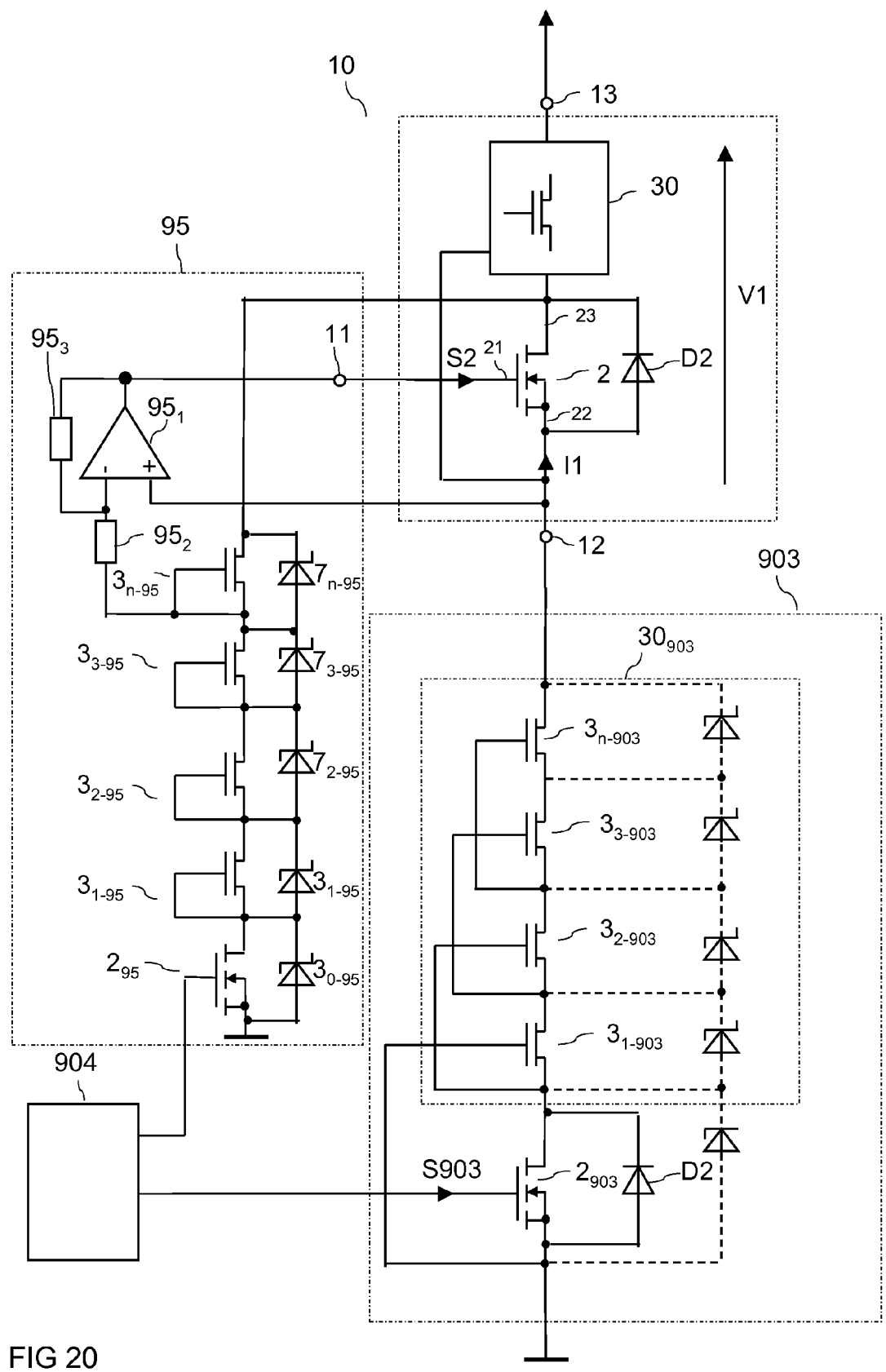
FIG. 20 illustrates an embodiment of a half-bridge including a signal communication path between a low-side control circuit and a high-side rectifier circuit.

FIG. 20 illustrate a modification of the circuit arrangement of FIG. 17. In the circuit arrangement of FIG. 20, the rectifier circuit 10 is operable to receive an external drive circuit Sin. This external drive signal Sin is provided from a control circuit 94 through a level shifter 95. The control circuit 94 may also provide the drive signal of the switch 903. The level shifter 95 includes a series circuit with a first transistor $2_{95}$ receiving the drive signal $S_{in}$ and a plurality of n (with n>1) second transistors $3_{1-95}$-$3_{n-95}$ connected in series with the first transistor. The series circuit with the first transistor $2_{95}$ and the second transistors $3_{1-95}$-$3_{n-95}$ is connected between the terminal 902 for the reference potential and the circuit node between the first transistor 2 of the rectifier circuit 10 and the arrangement 30 with the second transistors. Referring to FIG. 20, the first transistor $2_{95}$ of the level shifter may be implemented as an enhancement MOSFET, specifically an n-type enhancement MOSFET, while the second transistors $3_{1-95}$-$3_{n-95}$ may be implemented as depletion MOSFETs (or JFETs). Each of the second transistors $3_{1-95}$-$3_{n-95}$ has its gate terminal connected to its source terminal, wherein the source terminal of the 1st second transistor $3_{1-95}$ is connected to the drain terminal of the first transistor. A voltage limiting element $7_{0-95}$-$7_{n-95}$, such as a Zener diode or a series circuit of Zener diodes, is connected in parallel with the first transistor $2_{95}$ and each of the second transistors $3_{1-95}$-$3_{n-95}$.

An evaluation circuit $95_1$-$95_3$ compares the electrical potential at the load terminal of one of the second transistors, namely the upper second transistor $7_{n-95}$ in this embodiment, with the electrical potential at the first load terminal of the rectifier circuit 10 and generates the drive signal S2 for the first transistor 2 of the rectifier circuit 10 dependent on the comparison. The electrical potential at the second transistor $7_{n-95}$ is dependent on the switching state of the first transistor $2_{95}$ of the level shifter 95. This electrical potential is a high electrical potential when the first transistor $2_{95}$ is switched on and is a low electrical potential when the first transistor $2_{95}$ is switched on. Thus, by switching on and switching off the first transistor $2_{95}$ different electrical potentials are generated at the second transistor $3_{n-95}$ where this electrical potential is used to generate the drive signal of the first transistor 2 in the rectifier circuit 10. Referring to FIG. 20, the evaluation circuit includes an amplifier $95_1$ with a first (non-inverting) input coupled to the first load terminal 12 of the rectifier circuit 10, and with a second (inverting) input coupled to the load terminal (source terminal) of the second transistor $3_{n-95}$ through a resistor $95_2$ and coupled to the output through a further resistor $95_3$. The drive signal S2 is available at the output of the amplifier $95_1$.

The first semiconductor device 2 and the second semiconductor devices (second transistors) 3 that are represented by circuit symbols in the figures explained above can be implemented in many different ways. Some illustrative embodiments for implementing the second transistors 3 are explained with reference to Figures below.

Figure 21A:
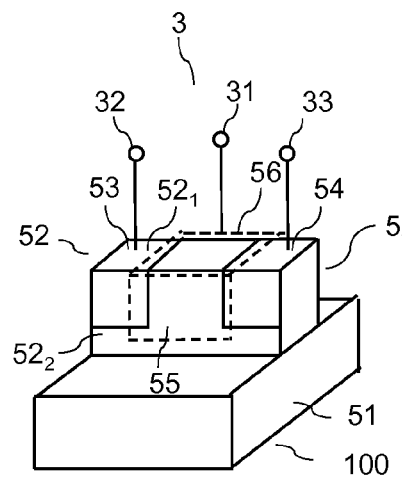
FIGS. 21A to 21C illustrates a first embodiment of one second semiconductor device implemented as FINFET.
Figure 21B:
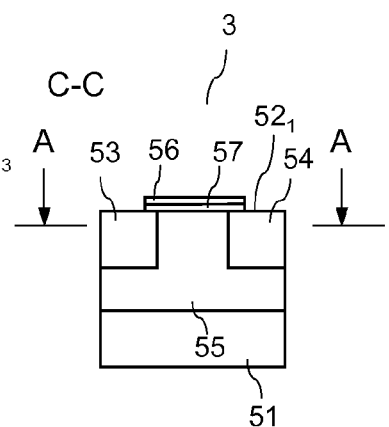
Figure 21C:
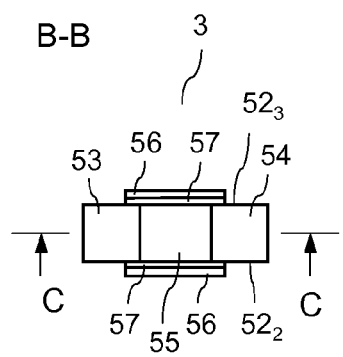

FIG. 21A shows a perspective view of one second transistor 3. FIG. 21B shows a vertical cross sectional view and FIG. 21C shows a horizontal cross sectional view of this second transistor 3. FIGS. 21A, 21B, 21C only show that section of the semiconductor body 100 in which the second transistor 3 is implemented. Active regions of the first semiconductor device 2 and active regions of neighbouring second transistors are not shown. The second transistor 3 according to FIGS. 21A to 21C is implemented as a MOSFET, specifically as a FINFET, and includes a source region 53, a drain region 54 and a body region 55 that are each arranged in a fin-like semiconductor section 52, which will also be referred to as "semiconductor fin" in the following. The semiconductor fin is arranged on a substrate 51. In a first horizontal direction, the source and drain regions 53, 54 extend from a first sidewall $52_2$ to a second sidewall $52_3$ of the semiconductor fin 52. In a second direction perpendicular to the first direction the source and drain regions 53, 54 are distant from one another and are separated by the body region 55. The gate electrode 56 (illustrated in dashed lines in FIG. 21A) is dielectrically insulated from the semiconductor fin 52 by a gate dielectric 57 and is adjacent to the body region 55 on the sidewalls $52_2$, $52_3$ and on a top surface $52_1$ of semiconductor fin 52.

Figure 22A:
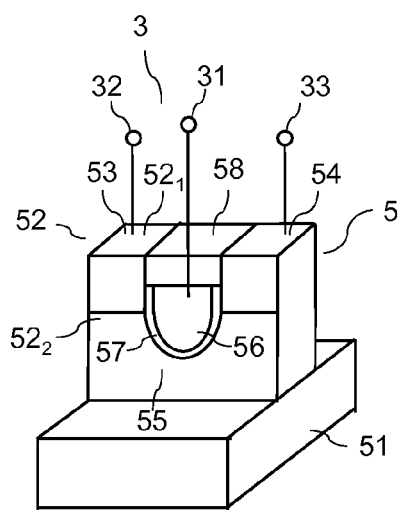
FIGS. 22A to 22C illustrates a second embodiment of one second semiconductor device implemented as FINFET.
Figure 22B:
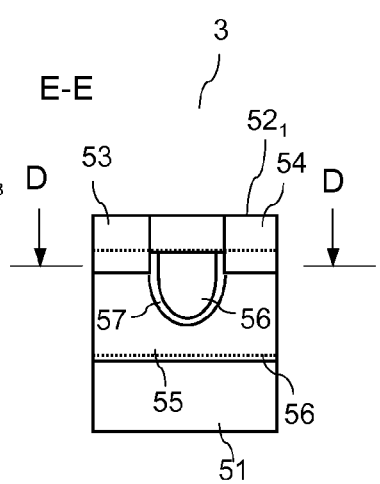
Figure 22C:
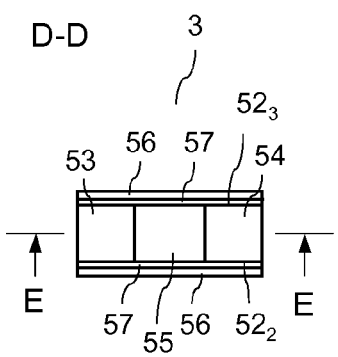

FIGS. 22A to 22C illustrate a further embodiment of one second transistor 3 implemented as a FINFET. FIG. 22A shows a perspective view, FIG. 22B shows a vertical cross sectional view in a vertical section plane E-E, and FIG. 22C shows a horizontal cross sectional view in horizontal section plane D-D. The vertical section plane E-E extends perpendicular to the top surface $52_1$ of the semiconductor fin 52 and in a longitudinal direction of the semiconductor fin 52. The horizontal section plane D-D extends parallel to the top surface $52_1$ of the semiconductor fin. The "longitudinal direction" of the semiconductor fin 52 corresponds to the second horizontal direction and is the direction in which the source and drain region 53, 54 are distant from one another.

The transistor 3 according to FIGS. 22A to 22C is implemented as a U-shape-surround-gate-FINFET. In this transistor, the source region 53 and the drain region 54 extend from the first sidewall $52_2$ to the second sidewall $52_3$ of the semiconductor fin 52 in the first horizontal direction, and are distant from one another in the second horizontal direction (the longitudinal direction of the semiconductor fin 52) that is perpendicular to the first horizontal direction. Referring to FIGS. 22A and 22B, the source region 53 and the drain region 54 are separated by a trench which extends into the body region 55 from the top surface $52_1$ of the semiconductor fin and which extends from sidewall $52_2$ to sidewall $52_3$ in the first horizontal direction. The body region 55 is arranged below the source region 53, the drain region 54 and the trench in the semiconductor fin 52. The gate electrode 56 is adjacent to the body region 55 in the trench and along the sidewalls $52_2$, $52_3$ of the semiconductor fin 52 and is dielectrically insulated from the body region 55 and the source and drain regions 53, 54 by the gate dielectric 57. In an upper region of the trench, which is a region in which the gate electrode 56 is not arranged adjacent to the body region 55, the gate electrode 56 can be covered with an insulating or dielectric material 58.

The second transistors of FIGS. 21A to 21C and of FIGS. 22A to 22C are, for example, implemented as depletion transistors, such as an n-type or a p-type depletion transistors. In this case, the source and drain regions 53, 54 and the body region 55 have the same doping type. The body region 55 usually has a lower doping concentration than the source and drain regions 53, 54. The doping concentration of the body region 55 is, e.g., about $2E18\ cm^{-3}$. In order to be able to completely interrupt a conducting channel in the body region 55 between the source region 53 and the drain region 54, the gate electrode 56 along the sidewalls $52_2$, $52_3$ of the semiconductor fin 52 completely extends along the semiconductor fin 52 in the second horizontal direction (the longitudinal direction). In the vertical direction the gate electrode 56 along the sidewalls $52_2$, $52_3$ extends from the source and drain regions 53, 54 to at least below the trench.

Referring to FIGS. 21A and 22A, the source region 53 is connected to the first load terminal (source terminal) 32, the drain region 54 is connected to the second load terminal (drain terminal) 33, and the gate electrode 56 is connected to the control terminal (gate terminal) 31. These terminals are only schematically illustrated in FIGS. 21A and 22A.

A thickness of the semiconductor fin 52, which is the dimension of the semiconductor fin in the first horizontal direction, and the doping concentration of the body region 55 are adjusted such that a depletion region controlled by the gate electrode 56 can extend from sidewall $52_2$ to sidewall $52_3$ in order to completely interrupt a conducting channel between the source and the drain region 53, 54 and to switch the second transistor 3 off. In an n-type depletion MOSFET a depletion region expands in the body region 55 when a negative control (drive) voltage is applied between the gate electrode 56 and the source region 53 or between the gate terminal 31 and the source terminal 32, respectively. Referring to the explanation provided with reference to FIG. 1, this drive voltage is dependent on the load voltage of the first semiconductor device 2, or is dependent on the load voltage of another one of the second transistors 3. How far the depletion region expands perpendicular to the sidewalls $52_2$, $52_3$ is also dependent on the magnitude of the control voltage applied between the gate terminal 31 and the source terminal 32. Thus, the thickness of the semiconductor fin 52 and the doping concentration of the body region 55 are also designed dependent on the magnitude of the control voltage that can occur during the operation of the semiconductor device arrangement.

Implementing the FINFETs illustrated in FIGS. 21A to 21C and 22A to 22C as U-shape-surround-gate-FINFET, in which the channel (body region) 55 has an U-shape and the gate electrode 56 is also arranged on sidewalls $52_2$, $52_3$ and on a top surface $52_1$ of the semiconductor fin 130 is only an example. These FINFETs could also be modified (not illustrated) to have the gate electrode 56 implemented with two gate electrode sections arranged on the sidewalls $52_2$, $52_3$ but not on the top surface $52_1$ of the semiconductor fin 52. A FINFET of this type can be referred to as double-gate FINFET. Each of the FINFETs explained above and below can be implemented as U-shape-surround-gate-FINFET or as double-gate FINFET. It is even possible to implement the individual second transistors 3 as different types of MOSFETs or FINFETs in one integrated circuit.

Each of the second transistors 3 and the first semiconductor device 2 can be implemented as FINFET. These individual FINFETs can be implemented in different ways to form the semiconductor arrangement 1.

Figure 23:
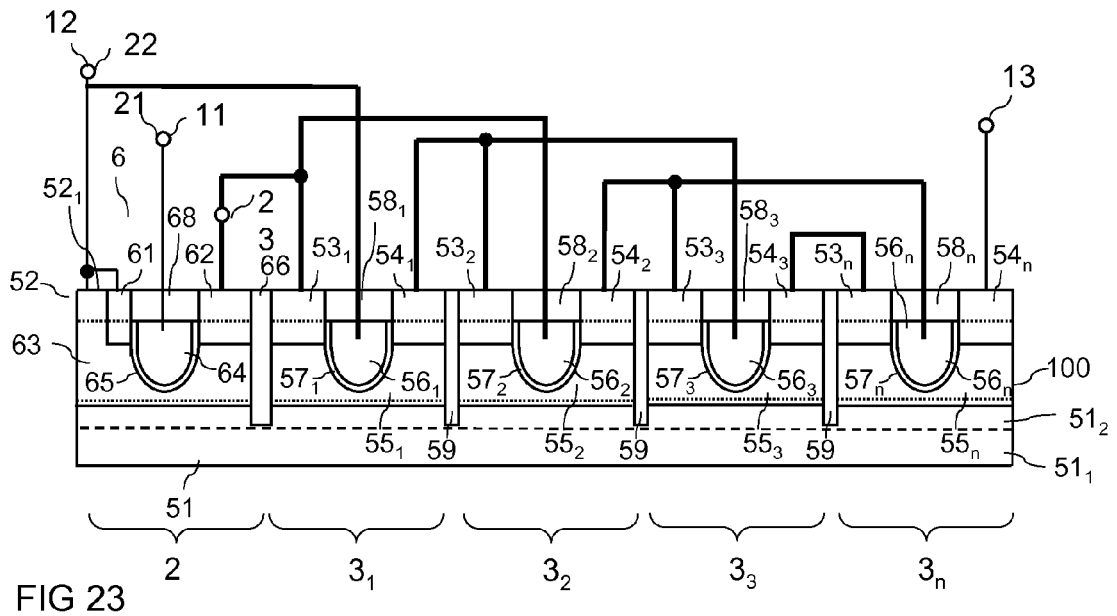
FIG. 23 illustrates a vertical cross sectional view of a semiconductor body according to a first embodiment in which a first semiconductor device and a plurality of second semiconductor devices are implemented in one semiconductor fin.

FIG. 23 illustrates a vertical cross sectional view of a semiconductor fin 52 in which active regions (source, drain and body regions) of a first semiconductor device 2 and of n second transistors 3 are arranged. In this embodiment, the first semiconductor device 2 and the second transistors are implemented as U-shape-surround-gate FINFET or as double-gate FINFET. In FIG. 23, like reference numbers are used to denote like features as in FIGS. 21A to 21C and 22A to 22C. In FIG. 23 the reference numbers of like features of the different second transistors $3_1$-$3_n$ have different indices (1, 2, 3, n).

Referring to FIG. 23, the active regions of neighboring second transistors 3 are insulated from each other by dielectric layers 59 which extend in a vertical direction of the semiconductor fin 52. These dielectric layers 59 may extend down to or down into the substrate 51. Further, the dielectric layers 59 extend from sidewall to sidewall of the semiconductor fin 52. However, this is out of view in FIG. 23. The active regions of the first semiconductor device 2 are dielectrically insulated from active regions of the 1st second transistor $3_1$ by a further dielectric layer 66 that also extends in a vertical direction of the semiconductor fin 52. In the first semiconductor device 2, a source region 61 and a drain region 62 are separated by a body region 63. The gate electrode 64 that is arranged in the trench (and the position of which at the sidewalls of the semiconductor fin is illustrated by dotted lines), extends from the source region 61 along the body region 63 to the drain region 62. The source region 61 is connected the first load terminal 22 that forms the first load terminal 12 of the semiconductor arrangement 1, the drain region 62 is connected to the second load terminal 23, and the gate electrode 64 is connected to the control terminal 21 that forms the control terminal 11 of the semiconductor arrangement 1. The body region 63 is also connected to the first load terminal 22.

The first semiconductor device 2 is, for example, implemented as an enhancement MOSFET. In this case, the body region 63 is doped complementarily to the source and drain regions 61, 62. In an n-type MOSFET, the source and drain regions 61, 62 are n-doped while the body region 63 is p-doped, and in a p-type MOSFET, the source and drain regions 61, 62 are p-doped while the body region 63 is n-doped.

According to one embodiment, the substrate 51 is doped complementarily to the active regions of the second transistors 3 and to the source and drain regions 61, 62 of the first semiconductor device 2. In this case, there is a junction isolation between the individual second transistors 3. According to a further embodiment (illustrated in dashed lines), the substrate is an SOI substrate and includes a semiconductor substrate $51_1$ and an insulation layer $51_2$ on the semiconductor substrate $51_1$. The semiconductor fin 52 is arranged on the insulation layer. In this embodiment, there is a dielectric layer between the individual second transistors 3 in the substrate 51.

Figure 24:
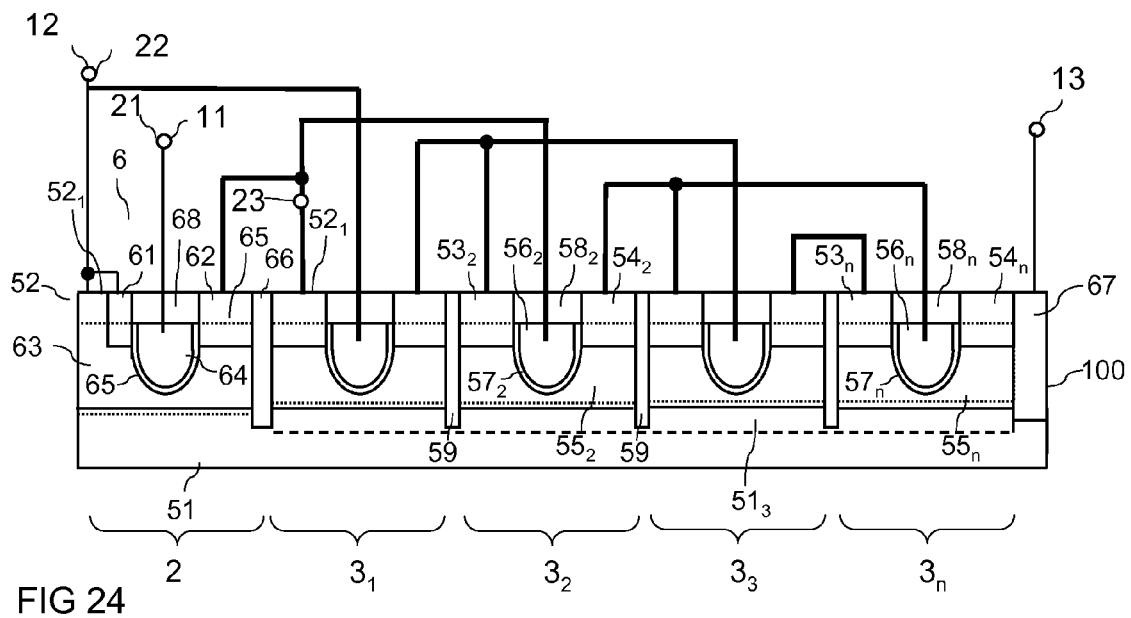
FIG. 24 illustrates a vertical cross sectional view of a semiconductor body according to a second embodiment in which a first semiconductor device and a plurality of second semiconductor devices are implemented in one semiconductor fin.

According to yet another embodiment, illustrated in FIG. 24, the substrate 51 has the same doping type as the active regions of the second transistors 3 and as the source and drain regions 61, 62 of the first semiconductor device 2. In this embodiment, the gate electrode 56 of the first semiconductor device 2 extends to the substrate, so that there is a conducting path in the body region between the source region 61 and the substrate 51 when the first semiconductor device 2 is in the on-state. Further the substrate is connected to the second load terminal 13 of the semiconductor arrangement through a contact region 67 of the same doping type as the substrate 51. The contact region 67 is more highly doped than the substrate 51 and extends from the first surface $52_1$ of the semiconductor fin 52 to the substrate. The contact region 67 may adjoin the drain region $54_n$ of the n-th second transistor 3. The contact region 67 is optional. A connection between the second load terminal 13 and the substrate 51 could also be provided through the drain and body regions $54_n$, $55_n$ of the second transistor $3_n$.

In the semiconductor arrangement of FIG. 24, the substrate 51 forms a current path that is parallel to the current path through the second transistors 3 or that is parallel to the ADZ. The substrate 51 is similar to the drift region in a conventional power transistor. In this embodiment, the body regions 55 of the individual second transistors 3 are coupled to the drift region 51.

According to further embodiment (illustrated in dashed lines in FIG. 24) the substrate 51 includes a semiconductor layer $51_3$ doped complementary to remaining sections of the substrate 51 and to the body regions 55 of the second transistors 3. This layer $51_3$ is arranged between the body regions 55 of the second transistors 3 and those sections of the substrate acting as a drift region and provides a junction insulation between the individual second transistors 3 in the substrate 51.

The semiconductor arrangement 1 of FIG. 3 with the diode 2 connected in series with the second transistors 3 can easily be obtained from the arrangements illustrated in FIGS. 21 and 22 by either connecting the control terminal of the first semiconductor device to the first load terminal 22 or by let the control terminal 21 floating. In this case, only the body diode of the MOSFET, which is the diode formed by the pn-junction between the body region 63 and the drain region 65 is active between the first and second load terminals 22, 23 of the second semiconductor device.

Each of the first semiconductor device 2 and the second transistors 3 (referred to as devices in the following) may include a plurality of identical cells (transistor cells) that are connected in parallel. Each of these cells can be implemented like the first semiconductor device 2 or like the second transistors 3, respectively, illustrated in FIGS. 21 and 22. Providing a plurality of cells connected in parallel in one device can help to increase the current bearing capability and to reduce the on-resistance of the individual device.

Figure 25:
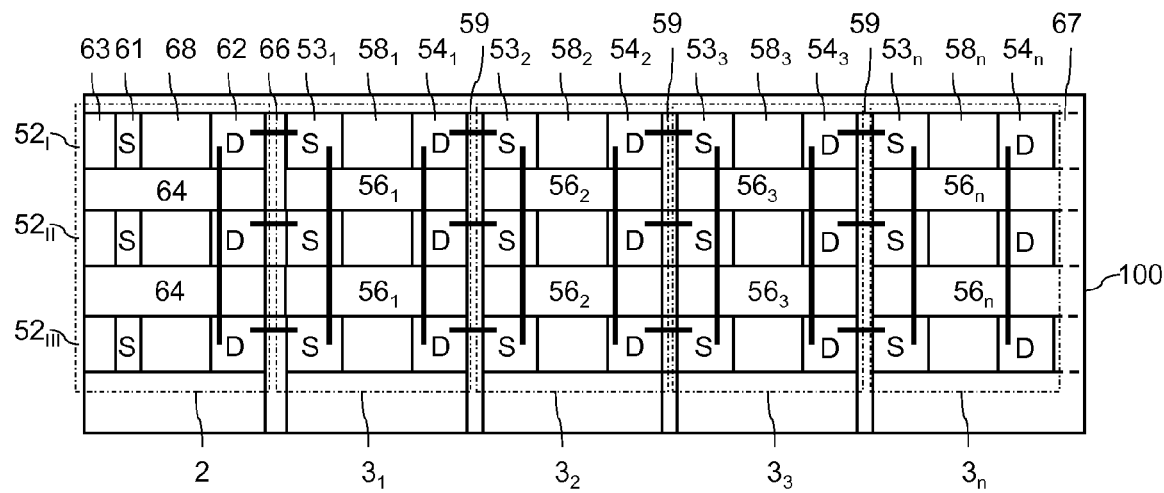
FIG. 25 illustrates a top view of a semiconductor body according to a third embodiment in which a first semiconductor device and a plurality of second semiconductor devices each including several FINFET cells are implemented.

FIG. 25 illustrates a top view on a semiconductor arrangement according to a first embodiment which includes a first semiconductor device 2 and a plurality of second transistors 3, with each of these devices having a plurality (from which three are illustrated) cells connected in parallel. The individual cells of one device are implemented in different semiconductor fins $52_I$, $52_{II}$, $52_{III}$. Each of these cells has a source region 61, 53 that is additionally labeled with "S" in FIG. 25, and a drain region 62, 54 that is additionally labeled with "D" in FIG. 25. The cells of one device are connected in parallel by having the source regions of the one device connected together and by having the drain regions of the one device connected together. These connections as well as connections between the load terminals of the different devices are schematically illustrated in bold lines in FIG. 25. Connections between the control terminals (gate terminals) and the load terminals of the different devices are not illustrated in FIG. 25. The connections between the cells and the different devices can be implemented using conventional wiring arrangements arranged above the semiconductor body and contacting the individual active regions (source and drain regions) through vias. Those wiring arrangements are commonly known so that no further explanations are required in this regard. The individual cells of one device 2, $3_1$, $3_2$, $3_3$, $3_n$ have a common gate electrode 64, $56_1$, $56_2$, $56_3$, $56_n$ arranged in the U-shaped trenches of the individual semiconductor fins and in trenches between the individual fins. These "trenches between the fins" are longitudinal trenches along the fins. All gates 64, $56_1$, $56_2$, $56_3$, $56_n$ are electrically isolated from each other by a dielectric 66 and 59.

Figure 26:
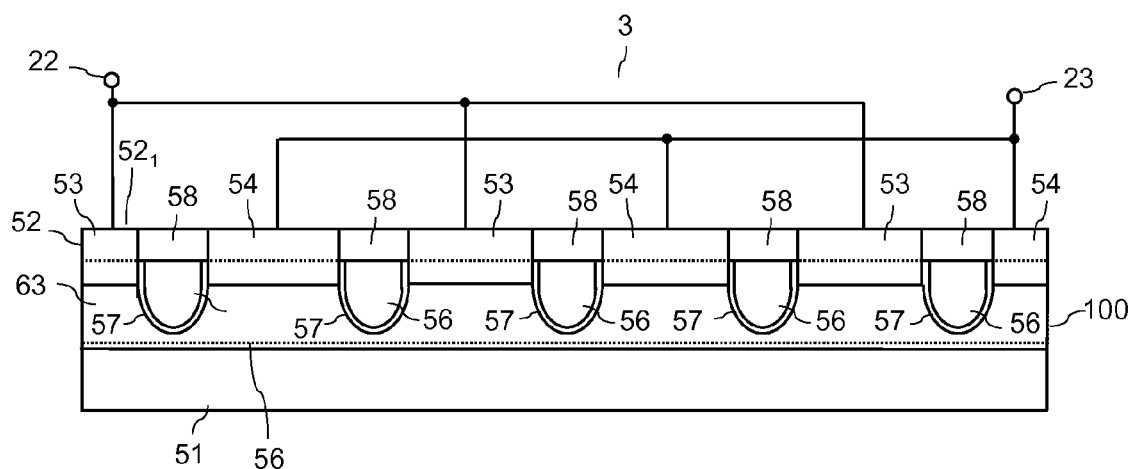
FIG. 26 illustrates a vertical cross sectional view of one second semiconductor device including several FINFET cells connected in parallel.

FIG. 26 illustrates a further embodiment for implementing one second transistor 3 with a plurality of transistor cells. In this embodiment, a plurality of transistor cells of the second transistor 3 are implemented in one semiconductor fin. In the longitudinal direction of the semiconductor fin 52, source and drain regions 53, 54 are arranged alternatingly with a source region 53 and a neighboring drain region 54 being separated by one (U-shaped) trench that accommodates the gate electrode 56. The source regions 53 are connected to the first load terminal 22, and the drain regions 54 are connected to the second load terminal 23, so that the individual transistor cells are connected in parallel. The gate electrode 56 is common to the individual transistor cells and extends along the sidewalls of the semiconductor fin 52 in the longitudinal direction. Each source region 53 and each drain region 54 (except for the source and drain regions arranged at the longitudinal ends of the semiconductor fin 52) is common to two neighboring transistor cells.

The concept of providing several transistor cells in one semiconductor fin explained with reference to FIG. 26 is, of course, also applicable to the implementation of the first semiconductor device 2.

Figure 27A:
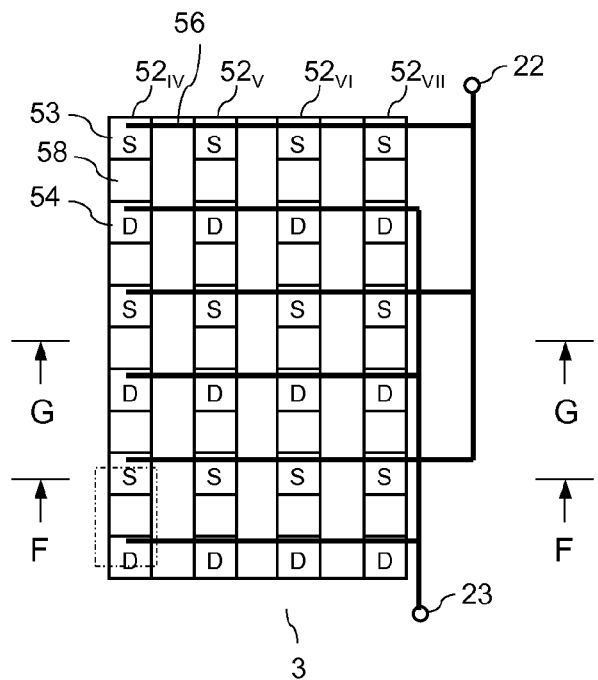
FIGS. 27A to 27C illustrates a further embodiment of one second semiconductor device including several FINFET cells connected in parallel.
Figure 27B:
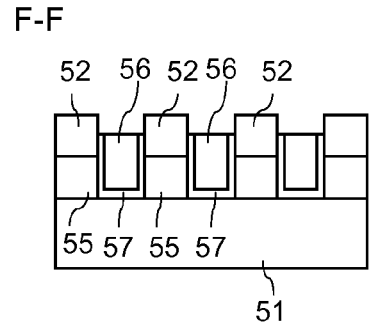
Figure 27C:
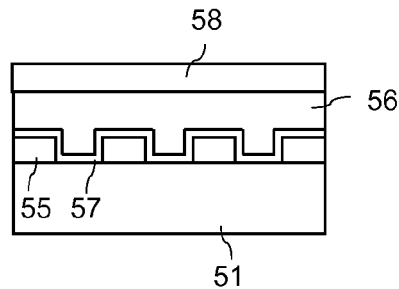

Referring to FIGS. 27A to 27C, one second transistor 3 may include a plurality of semiconductor fins $52_{IV}$, $52_V$, $52_{VI}$, $52_{VII}$, with each semiconductor fin $52_{IV}$-$52_{VII}$ including a plurality of transistor cells (one of these cells is highlighted by a dashed and dotted frame in FIG. 27A). FIG. 27A shows a top view of one second transistor 3, FIG. 27B shows a vertical cross sectional view in a section plane F-F cutting through source regions in different fins, and FIG. 27C shows a vertical cross sectional view in a section plane G-G cutting through the trenches with the gate electrode 56 in different fins. Referring to FIG. 27A, the source regions of the individual transistor cells are connected to the first load terminal 22 and the drain regions of the individual transistor cells are connected to the second load terminal 23 so that the individual transistor cells are connected in parallel. These connections are only schematically illustrated in FIG. 27A.

The concept of providing a plurality of semiconductor fins with each semiconductor fin including a plurality of transistor cells explained with reference to FIGS. 27A to 27C is, of course, also applicable to the implementation of the first semiconductor device 2.

Although only 20 transistor cells are illustrated in FIG. 27A, namely five cells in each of the four semiconductor fins $52_{IV}$-$52_{VII}$, one second transistor 3 or the first semiconductor device 2 may include up to several thousand or even up to several ten or several hundred million transistor cells connected in parallel. The individual transistor cells form a matrix of transistor cells that are connected in parallel. A device (first semiconductor device 2 or second transistor 3) having a plurality of transistor cells arranged in a matrix will be referred to as matrix device in the following.

Figure 28:
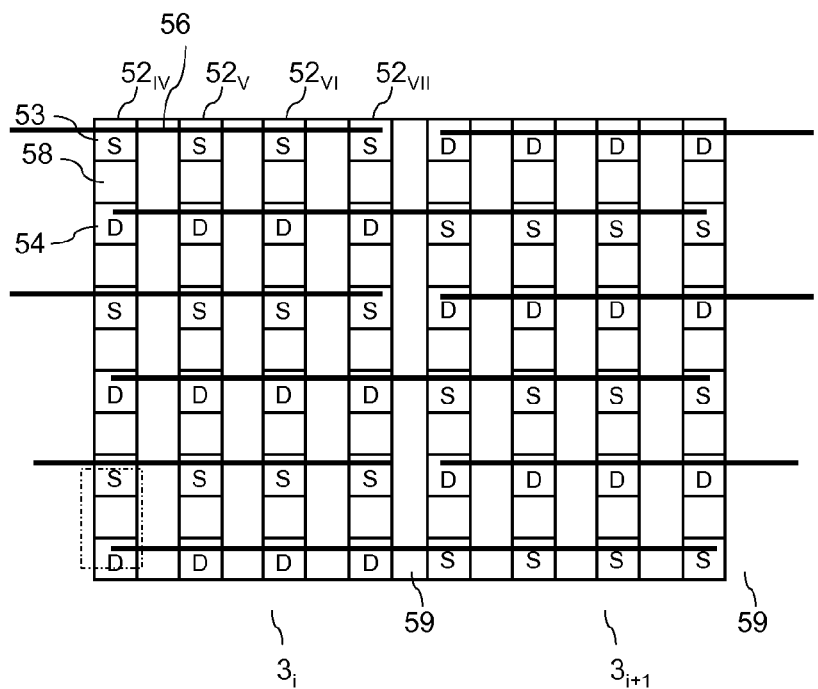
FIG. 28 illustrates two second semiconductor devices of the type illustrated in FIG. 27 connected in series.

FIG. 28 illustrates how second transistors implemented as matrix devices can be connected in series. For illustration purposes, only two second transistors $3_i$, $3_{i+1}$ are shown in FIG. 28. For connecting these two transistors in series, the source regions of the second transistor $3_{i+1}$ are connected to the drain regions of the transistor $3_i$. The source regions of the second transistor $3_i$ are connected to the drain regions of second transistors $3_{i-1}$ (not illustrated), and the drain regions of the second transistor $3_{i+1}$ are connected to the source regions of second transistors $3_{i+2}$ (not illustrated).

Figure 29:
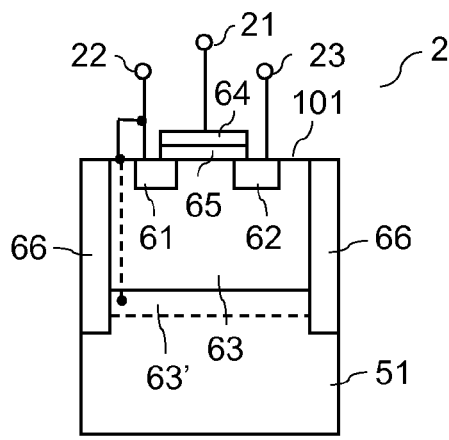
FIG. 29 illustrates a vertical cross sectional view of a first transistor according to a further embodiment.

FIG. 29 illustrates a vertical cross sectional view of a transistor cell of the first transistor 2 according to a further embodiment. Several of the transistor cells of FIG. 29 may be connected in parallel to form the first transistor 2. The transistor cell of FIG. 29 is implemented with a planar gate electrode 64. The gate electrode 64 is arranged above the first surface 101 of the semiconductor body 100 and is dielectrically insulated from the body region 63 by the gate dielectric 65. The source and drain regions 61, 62 are arranged in the region of the first surface 101 and are distant in a lateral direction of the semiconductor body 100. The body region 63 adjoins the substrate 51, where the substrate 51 may be implemented in accordance with one of the embodiments explained before. Further, the body region 63 is electrically connected to the source terminal 22. Referring to FIG. 19, the vertical dielectric layer 66 may extend through the body region 63 to or into the substrate 51. The vertical dielectric layer 66 may surround the body region 63 in a horizontal plane of the semiconductor body 100, which is a plane perpendicular to the section plane illustrated in FIG. 19. The first transistor 2 of FIG. 19 may be implemented as an enhancement transistor. In this case, the body region 63 is doped complementary to the source and drain regions 61, 62. Concerning the doping types of the individual device regions reference is made to the embodiments explained before.

According to one embodiment, there is a pn-junction between the body region 63 and the substrate 51. This pn-junction can be formed by implementing the body region 63 and the substrate 51 as complementarily doped regions. Alternatively, a semiconductor region 55' of the same doping type as the source and drain region 53, 54 is arranged between the body region 55 and the substrate 51. This optional semiconductor region 55' may be connected to the source region 53 (as schematically illustrated in dashed lines in FIG. 30).

Figure 30:
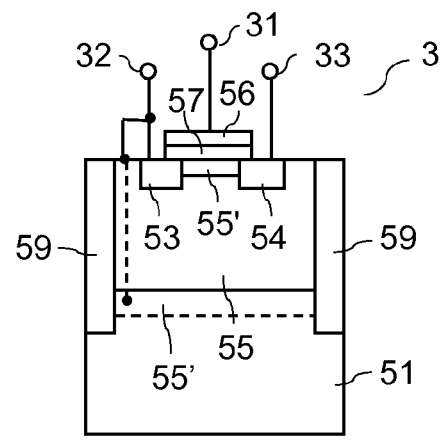
FIG. 30 illustrates a vertical cross sectional view of a second transistor according to a further embodiment.

FIG. 30 illustrates a vertical cross sectional view of a transistor cell of one second transistor 2 according to a further embodiment. Several of the transistor cells of FIG. 20 may be connected in parallel to form one second transistor 3. The transistor cell of FIG. 20 is implemented with a planar gate electrode 56. The gate electrode 56 is arranged above the first surface 101 of the semiconductor body 100 and is dielectrically insulated from the body region 55 by the gate dielectric 57. The source and drain regions 53, 54 are arranged in the region of the first surface 101 and are distant in a lateral direction of the semiconductor body 100. The body region 55 adjoins a layer of same doping as source and drain and is connected to source. This layer adjoins the substrate 51, where the substrate 51 may be implemented in accordance with one of the embodiments explained before. Further, the body region 55 is electrically connected to the source terminal 32. Referring to FIG. 30, the vertical dielectric layer 59 may extend through the body region 55 to or into the substrate 51. The vertical dielectric layer 59 may surround the body region 55 in a horizontal plane of the semiconductor body 100, which is a plane perpendicular to the section plane illustrated in FIG. 20.

The second transistor 3 of FIG. 30 may be implemented as a depletion transistor. In this case, the body region 55 is doped complementary to the source and drain regions 53, 54 and includes a channel region 55' of the same doping type as the source and drain regions 53, 54 along the gate dielectric 57. The channel region 55' extends from the source region 53 to the drain region 54. In an n-type depletion transistor, the source region 53, the drain region 54 and the channel region 55' are n-doped while the body region is p-doped. In a p-type depletion transistor, the doping types of these device regions are complementary to those in an n-type transistor.

According to one embodiment, there is a pn-junction between the body region 55 and the substrate 51. This pn-junction can be formed by implementing the body region 55 and the substrate 51 as complementarily doped regions. Alternatively, a semiconductor region 63' of the same doping type as the source and drain region 61, 62 is arranged between the body region 63 and the substrate 51. This optional semiconductor region 63' may be connected to the source region 61 (as schematically illustrated in dashed lines in FIG. 29).

Figure 31:
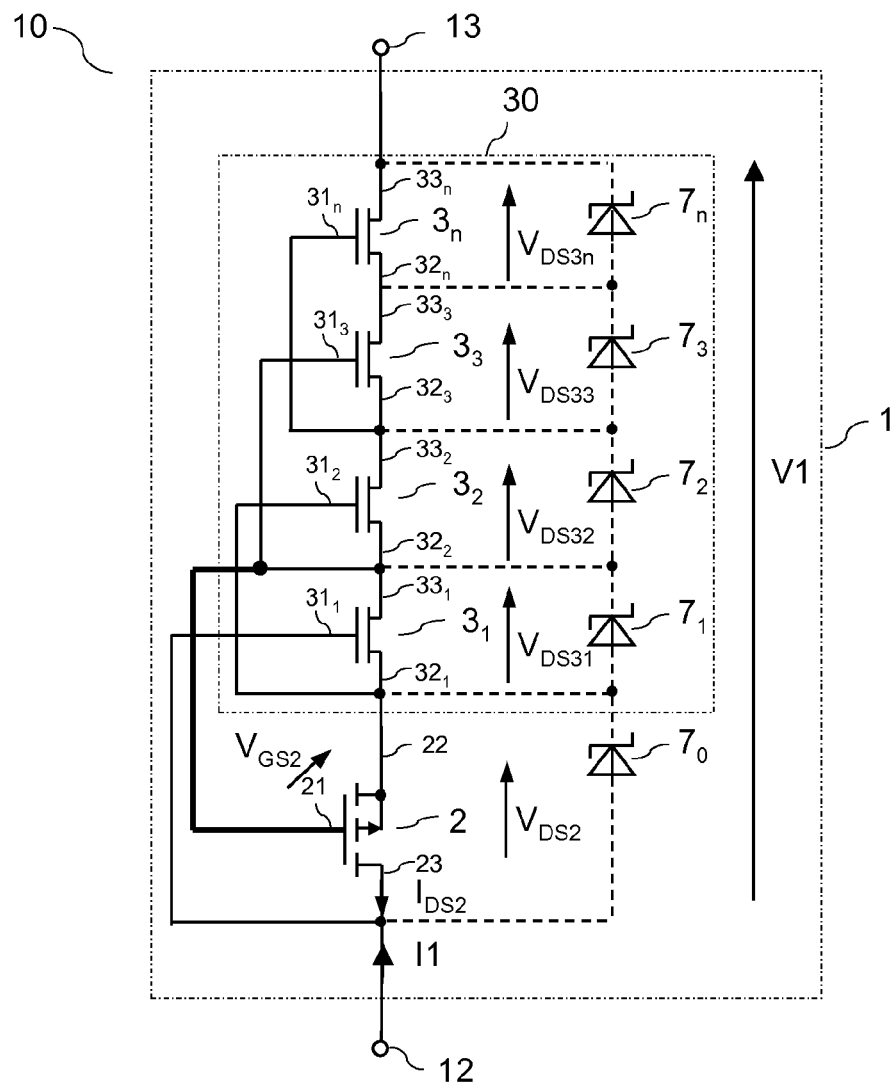
FIG. 31 illustrates another embodiment of a rectifier circuit including a first semiconductor device and a plurality of second semiconductor devices.

FIG. 31 illustrates a further embodiment of a rectifier circuit 10 with a first semiconductor device 2 and a plurality of second semiconductor devices $3_1$-$3_n$ that is configured to "automatically" conduct when the voltage V1 between the first and second load terminals 12, 13 has the first polarity and to block when this voltage V1 has the second polarity. The rectifier circuit 10 of FIG. 31 is a modification of the rectifier circuit of FIGS. 8A and 8B. The arrangement 30 with the second semiconductor devices $3_1$-$3_n$ of FIG. 31 corresponds to the arrangements 30 explained with reference to FIGS. 8A and 8B. That is, each of the second semiconductor devices $3_1$-$3_n$ connected in series with the first semiconductor device 2 is configured to receive as a drive voltage either a load path voltage of at least one second semiconductor device $3_1$-$3_n$, or at least a load path voltage of the first semiconductor device 2. In the embodiment of FIG. 31 the 1st second semiconductor device $3_1$ receives the load path voltage $V_{DS2}$ of the first semiconductor device 2 as a drive voltage, and each of the other second semiconductor devices $3_2$-$3_n$ receives as a drive voltage the load path voltage of one neighboring second semiconductor device. That is, a 2nd second semiconductor device $3_2$ receives the load path voltage of the 1st second semiconductor device $3_1$ as a drive voltage, and so on. However, this specific topology is only an example. The arrangement 30 could easily be modified such that at least some of the second semiconductor devices $3_1$-$3_n$ receive as a drive voltage the sum of the load path voltages of two or more neighboring second semiconductor devices.

Like in the embodiments explained hereinbefore, the rectifier elements $7_0$-$7_n$ that can be implemented as Schottky diodes, Avalanche or Zener diodes and that are connected in parallel with the first semiconductor device 2 and the second semiconductor devices $3_1$-$3_n$ are optional.

According to one embodiment, the first semiconductor device 2 is a transistor, in particular a field-effect transistor, of a first conduction type, and the second semiconductor devices $3_1$-$3_n$ are transistors, in particular field-effect transistors of a second conduction type complementary to the first conduction type. Just for explanation purposes, it is assumed that the first conduction type is a p-type and that the second conduction type is an n-type. However, the operating principle explained below applies to a rectifier circuit with an n-type first semiconductor device 2 and with p-type second semiconductor devices $3_1$-$3_n$ as well. According to one embodiment, the first semiconductor device 2 is a MOSFET (Metal-Oxide-Semiconductor Field-Effect Transistor), in particular an enhancement MOSFET with a threshold voltage of substantially 0V, and the second semiconductor devices $3_1$-$3_n$ are depletion MOSFETs or JFETs (Junction Field-Effect Transistors), HEMTs (High-Electron-Mobility Transistors) or nanotubes.

For explanation purposes it is assumed that the first semiconductor device 2 is a p-type MOSFET and that the second semiconductor devices $3_1$-$3_n$ are n-type MOSFETs or n-type JFETs, HEMTs or nanotubes. Referring to FIG. 31, a source terminal of the second semiconductor device 2 is connected to the second semiconductor devices arrangement 30. That is, the source terminal 22 of the second semiconductor device 2 is connected to a source terminal $32_1$ of the first 1st second semiconductor device $3_1$. A drain terminal 23 of the second semiconductor device 2 is connected to the first load terminal 12 of the rectifier circuit. The second semiconductor device 2 receives as a drive voltage the load path voltage of at least one second semiconductor device $3_1$-$3_n$. In the present embodiment, the second semiconductor device 2 receives as a drive voltage the load path voltage of the 1st second semiconductor device $3_1$. For this, a gate terminal 21 of the second semiconductor device 2 is connected to a circuit node common to the load paths of the 1st second semiconductor device $3_1$ and the second semiconductor device $3_2$. According to a further embodiment (not illustrated in FIG. 31) the second semiconductor device 2 receives as a drive voltage the load path voltages of two or more of the second semiconductor devices $3_1$-$3_n$. For this, the gate terminal 21 of the second semiconductor device 2 is connected to a circuit node common to the load paths of another pair of second semiconductor devices.

Figure 32:
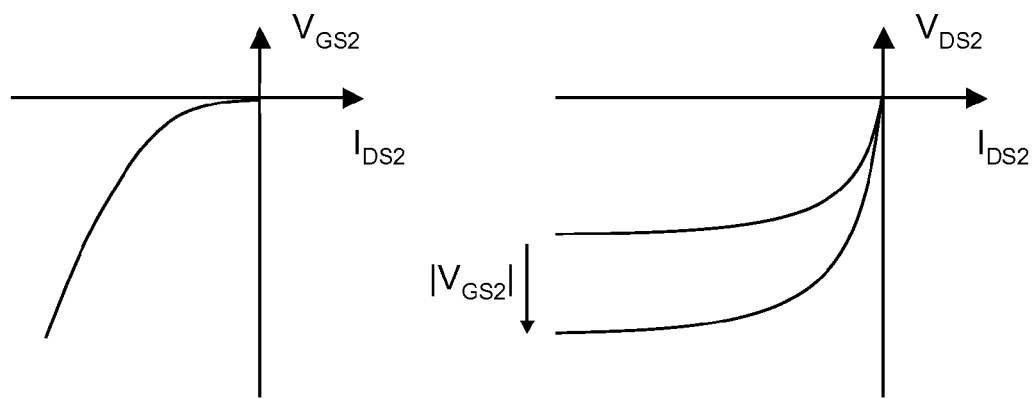
FIG. 32 schematically shows characteristic curves of a first semiconductor device implemented as a p-type MOSFET.

FIG. 32 schematically shows characteristic curves of the second semiconductor device 2 when implemented as a p-type MOSFET with a threshold voltage of substantially 0V. FIG. 32 shows the load current (drain-source current) $I_{DS2}$ of the second semiconductor device 2 dependent on the drive voltage (gate-source voltage) $V_{GS2}$. According to FIG. 32, the load current $I_{DS2}$ increases, beginning at $V_{GS}$=0, as the magnitude of the drive voltage $V_{GS}$ increases. Referring to FIG. 32, the p-type MOSFET 2 conducts when the drive voltage $V_{GS2}$ is negative, that is when the gate potential (the electrical potential at the gate terminal 21) is below the source potential (the electrical potential at the source terminal 22). The drain-source current $I_{DS2}$ is negative, that is the current flows in the direction opposite to the direction indicated in FIG. 31.

The operating principle of the rectifier circuit 10 of FIG. 31 is as follows. When the voltage V1 between the first and second load terminals 12, 13 is zero, so that the electrical potentials at each of the circuit nodes of the rectifier circuits 10 are zero, the second semiconductor device 2 and the third semiconductor devices $3_1$-$3_n$ are switched on (conducting). However, a load current I1 through the rectifier circuit 10 is zero. As the voltage V1 increases to a positive voltage level (a voltage level with the first polarity) a load current I1 flows through the rectifier circuit 10 in a direction as indicated in FIG. 31. Due to the inevitable on-resistances of the first semiconductor device 2 and the second semiconductor devices $3_1$-$3_n$ voltage levels of load path voltages $V_{DS2}$ and $V_{DS31}$-$V_{DS3n}$ of the first semiconductor device 2 and of the second semiconductor devices $3_1$-$3_n$ are different from zero and have polarities as indicated in FIG. 31 when a load current I1 flows through the rectifier circuit 10. In the embodiment of FIG. 31, the load path voltage $V_{DS31}$ of the second semiconductor device $3_1$ causes the gate-source voltage $V_{GS2}$ to become negative, and causes the first semiconductor device 2 to increase its conductivity.

When the voltage V1 has the second polarity (a polarity opposite to the polarity indicated in FIG. 31) the gate-source voltage $V_{GS2}$ of the second semiconductor device 2 becomes positive, so that the first semiconductor device 2 switches off. As the voltage V1 increases, the load path voltage $V_{DS2}$ of the second semiconductor device 2 increases (and has a polarity opposite to the polarity indicated in FIG. 31) until it reaches the threshold voltage of the second semiconductor device $3_1$. When the second semiconductor device $3_1$ switches off, the load path voltage $V_{DS31}$ of the second semiconductor device $3_1$ increases until it reaches the threshold voltage of the second semiconductor device $3_2$, and so on.

Thus, the rectifier circuit 10 of FIG. 31 automatically conducts a current when the voltage V1 has the first polarity, and automatically blocks when the voltage V1 has the second polarity. The rectifier circuit 10 of FIG. 31 can be used in each of the application circuits explained hereinbefore. Further, the individual semiconductor devices of the rectifier circuit 10 of FIG. 31 can be implemented as explained with reference to FIGS. 21A to 30 explained hereinbefore.

Figure 33:
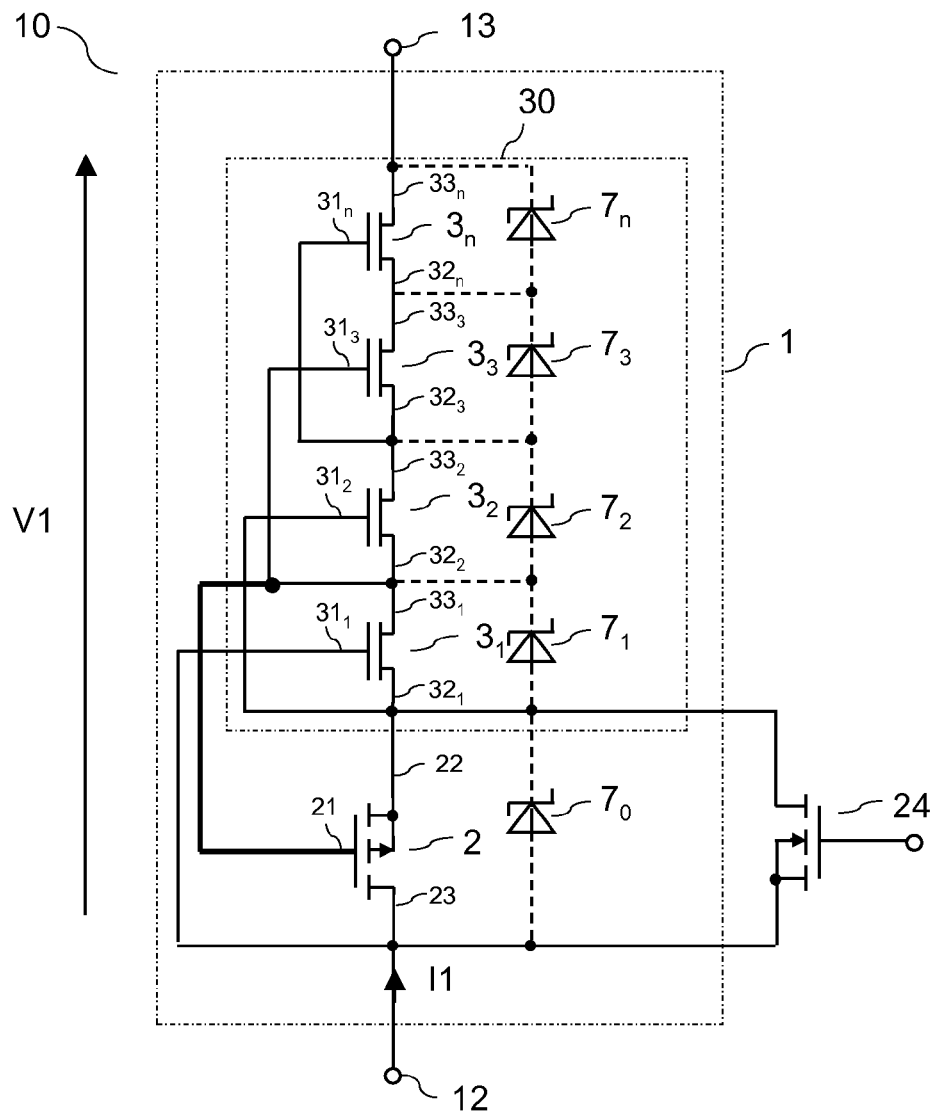
FIG. 33 illustrates a first modification of the rectifier circuit of FIG. 31.

FIG. 33 shows an electronic circuit that includes the rectifier circuit 10 of FIG. 31 and that additionally includes a switching element 24 connected in parallel with the first semiconductor device 2. The switching element is implemented as a transistor of the second conduction type, specifically as an n-type MOSFET 24 in the embodiment of FIG. 33. This transistor 24 has a drain terminal connected to the second semiconductor devices arrangement 30 and has its source terminal connected to the first load terminal 12. In this embodiment, the further transistor 24 can be switched on and off independent of the first semiconductor device 2, wherein in the on-state the further transistor device 24 bypasses the load path of the first semiconductor device 2. Thus, the electronic circuit of FIG. 33 can conduct a current when the voltage V1 has the second polarity and when the further transistor 24 is switched on. When the further transistor 24 is switched off, and the voltage V2 has the second polarity, the rectifier circuit 10 blocks in the way explained with reference to FIG. 31 before. When the voltage V1 has the first polarity, the rectifier circuit 10 conducts a current. In this case, the first semiconductor device 2 bypasses an internal body diode (not illustrated) of the further transistor 24.

Modifications of the rectifier circuit 10 of FIG. 31 are explained with reference to FIGS. 34 to 36 below. Each of these rectifier circuits 10 can be implemented together with a further transistor corresponding to the further transistor 24 of FIG. 33.

Figure 34:
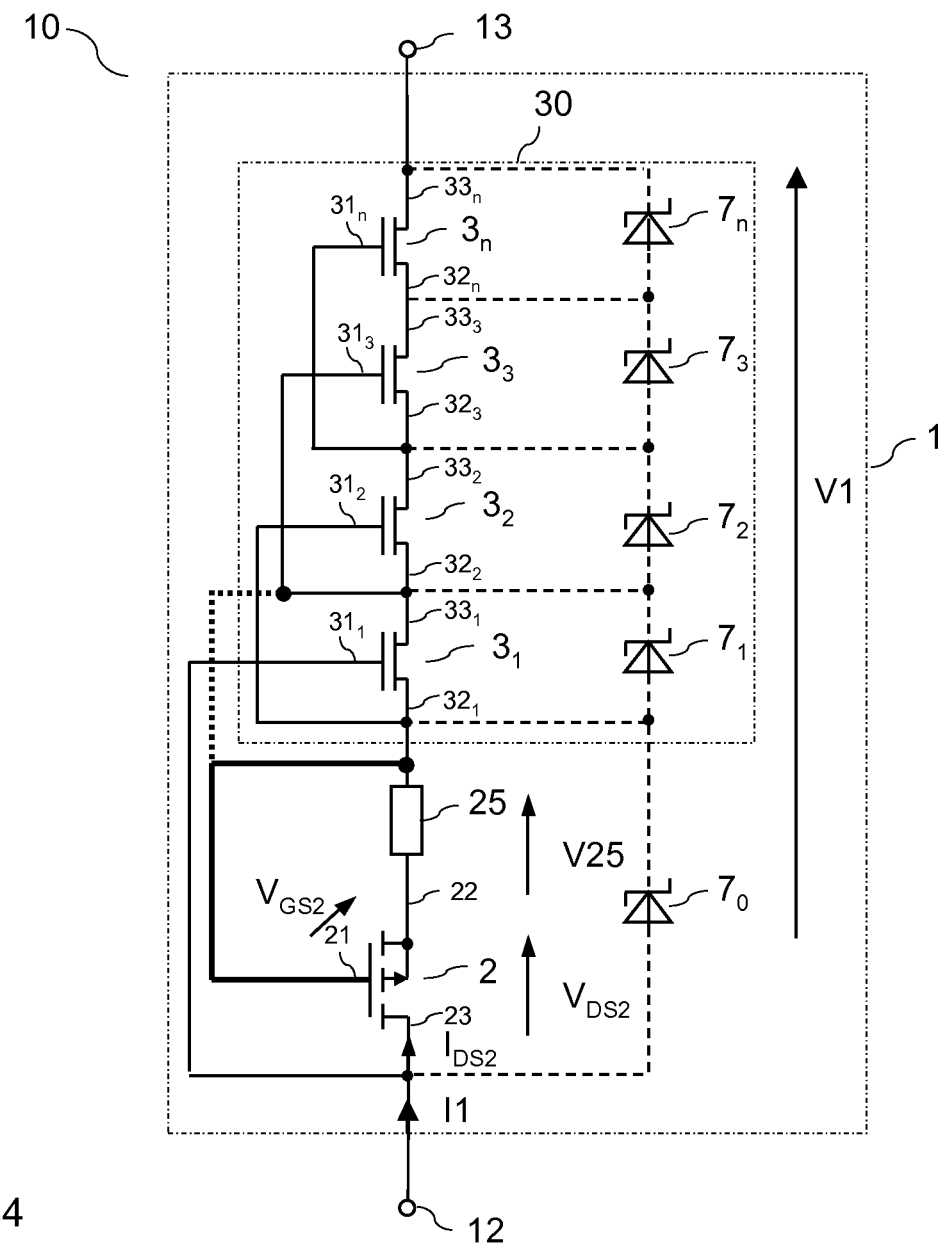
FIG. 34 illustrates a second modification of the rectifier circuit of FIG. 31.

The rectifier circuit of FIG. 34 is based on the rectifier circuit of FIG. 31 and additionally includes a resistor 25 connected in series with the first semiconductor device 2 and between a first semiconductor device 2 and the second semiconductor devices arrangement 30. The gate terminal of the first semiconductor device 2 is connected to a circuit node common to the resistor 25 and the second semiconductor devices arrangement 30. In this embodiment, the gate-source voltage $V_{GS2}$ corresponds to a voltage V25 across the resistor 25, wherein this voltage V25 increases when the voltage V1 has the first polarity and when the current I1 increases. That is, the first semiconductor device 2 receives as a drive voltage at least the voltage across the resistor 25. According to a further embodiment, illustrated in dotted lines, the gate terminal of the first semiconductor device 2 is connected to a circuit node common to load paths of two second semiconductor devices as explained with reference to FIG. 31.

Figure 35:
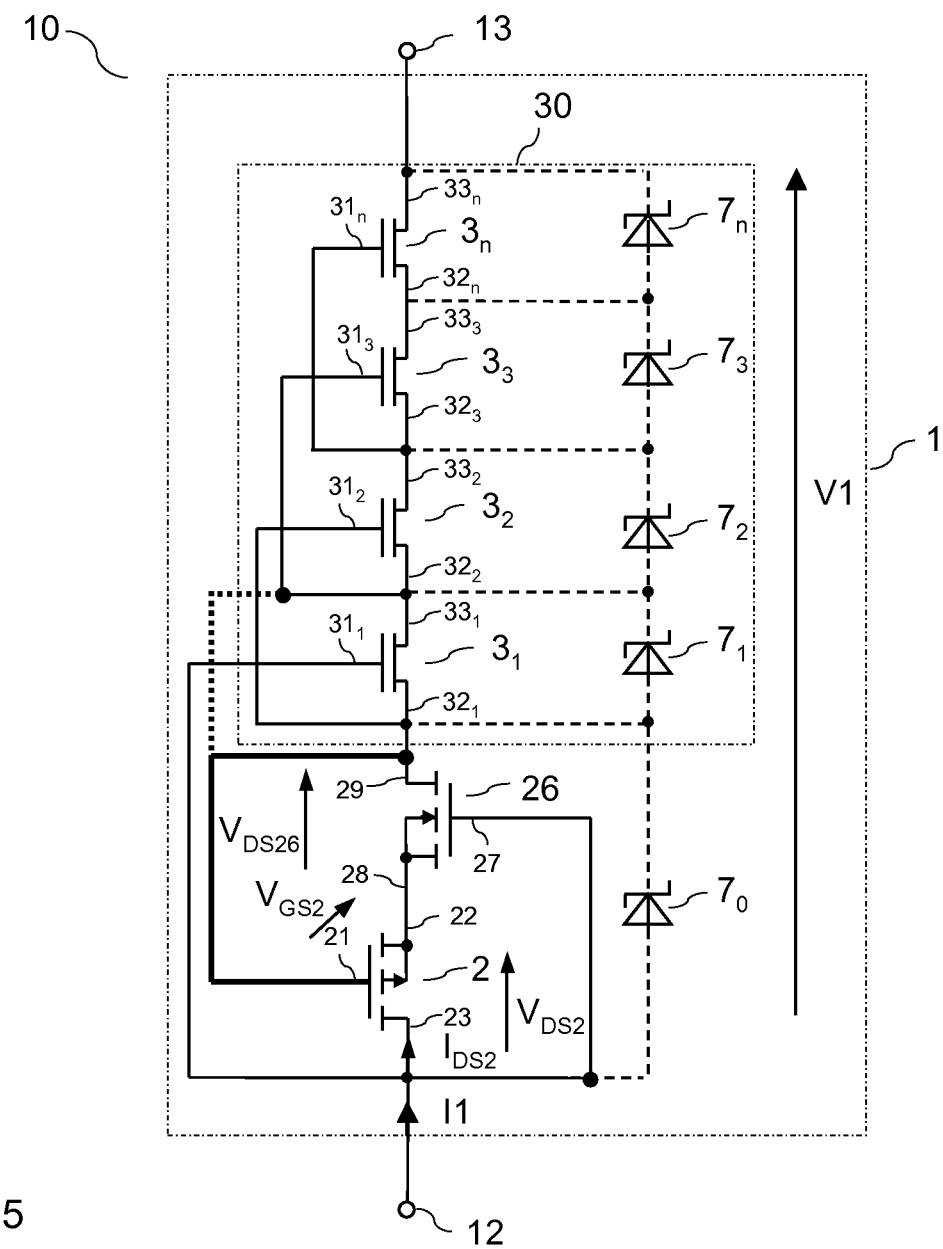
FIG. 35 illustrates a third modification of the rectifier circuit of FIG. 31.

FIG. 35 illustrates a modification of the rectifier circuit of FIG. 34. In the rectifier circuit of FIG. 35 a transistor 26 of the second conductivity type is connected between the first semiconductor device 2 and the second semiconductor devices arrangement 30. In the present embodiment, the transistor 26 is an n-type MOSFET that has a source terminal 28 connected to the source terminal 22 of the first semiconductor device 2, and that has a drain terminal 29 connected to the second semiconductor devices arrangement 30. A gate terminal 27 of the transistor 26 is connected to the first load terminal 12. The threshold voltage of the transistor 26 is substantially 0V.

The operating principle of the rectifier circuit 10 of FIG. 35 is as follows. As the voltage V1 is zero, the individual semiconductor devices in the rectifier circuit 10 are conducting, but the current I1 is zero. As the voltage V1 increases and has the first polarity, a current I1 flows in a direction as indicated in FIG. 35. The transistor 26 receives the load path voltage $V_{DS2}$ of the first semiconductor device 2 as a drive voltage, wherein the transistor 26 increases its conductivity as the load path voltage $V_{DS2}$ increases.

When the voltage V1 has the second polarity, the second semiconductor device 2 switches off as explained with reference to FIG. 31 before. When the first semiconductor device switches off, the load path voltage has a polarity opposite to the polarity indicated in FIG. 35 and the magnitude of the load path voltage increases. This load path voltage switches off the transistor 26 so that the overall voltage across the first semiconductor device 2 and the transistor 26 increases as the voltage V1 increases. The second semiconductor device $3_1$ receives the voltage across the first semiconductor device 2 and the transistor 26 as a drive voltage in the present embodiment.

Referring to FIG. 35, the first semiconductor device 2 receives as the drive voltage $V_{GS2}$ the load path voltage $V_{DS26}$ of the transistor 26. However, this is only an example. According to a further embodiment (illustrated in dotted lines in FIG. 35) the first semiconductor device 2 receives the load path voltage $V_{DS26}$ of the transistor 26 plus the load path voltage of at least one of the second semiconductor devices $3_1$-$3_n$ as the drive voltage $V_{GS2}$.

Figure 36:
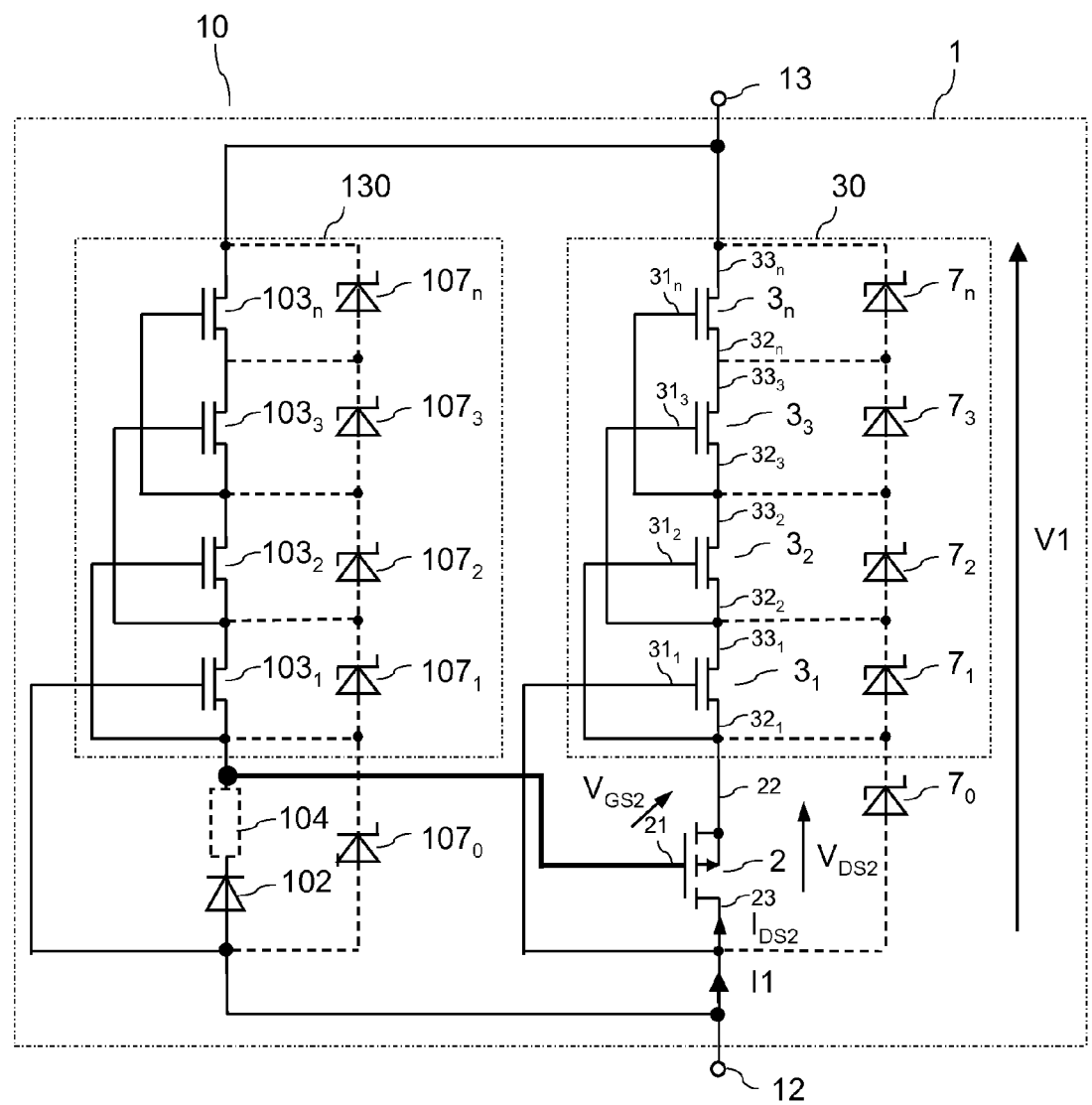
FIG. 36 illustrates a fourth modification of the rectifier circuit of FIG. 31.

FIG. 36 illustrates a further embodiment of the rectifier circuit 10. The rectifier circuit 10 of FIG. 36 is based on the rectifier circuit of FIG. 31 and additionally includes a voltage divider circuit connected between the first load terminal 12 and the second load terminal 13 and configured to drive the first semiconductor device 2. The voltage divider circuit is implemented like the rectifier circuit of FIG. 8A and includes a rectifier element 102, such as a diode, and a second semiconductor devices arrangement 130 with a plurality of second semiconductor devices $103_1$-$103_n$ connected in series with the rectifier element 102. Optionally, rectifier elements, such as Schottky diodes, Avalanche or Zener diodes, $107_0$-$107_n$ are connected in parallel with the second semiconductor devices $103_1$-$103_n$ and the rectifier element 102. The second semiconductor devices arrangement 130 can be implemented as explained with reference to the second semiconductor devices arrangement 30 hereinbefore. The second semiconductor devices arrangement 130 of the voltage divider can be implemented like the semiconductor devices arrangement 30. However, it is also possible to implement these two second semiconductor devices arrangements 130, 30 differently.

Optionally, a resistor 104 is connected between the rectifier element 102 and the ADR 130. The operating principle of the rectifier circuit 10 of FIG. 36 is as follows. For explanation purposes it is assumed that the second semiconductor devices $103_1$-$103_n$ have the same conductivity type as the second semiconductor devices $3_1$-$3_n$ of the ADR 30. The voltage divider circuit conducts when the voltage V1 has the first polarity. In this case, a voltage drop across the rectifier element 102 and the optional resistor 104 switches on the first semiconductor device 2. According to one embodiment, the rectifier element 102 and the ADR 130 are implemented such that the voltage V1 substantially drops across the rectifier element 102 and the optional resistor 104.

When the voltage V2 has the second polarity, the voltage divider circuit blocks, wherein a voltage V102 across the rectifier element increases until the threshold voltage of the second semiconductor device $103_1$ directly connected to the rectifier element 102 or the optional resistor 104 switches off. In this operation state, the ADR 130 protects the rectifier element 102 against high voltages. However, a voltage drop across the rectifier element 102 is sufficiently high to switch off the first semiconductor device 2.

A conventional MOSFET that can be used as a synchronous rectifier can be characterized by the following parameters, the on-resistance $R_{ON}$, the voltage blocking capability (breakthrough voltage) $V_{BR}$, the output charge $Q_{OSS}$ stored in the output capacitance of the MOSFET when the MOSFET is in the off-state, and the electrical charge $Q_{RR}$ stored in the MOSFET when the body diode is conducting. $Q_{RR}$ results from a charge carrier plasma that is generated in the MOSFET when the body diode is forward biased.

The charge $C_{OSS}$ stored in the output capacitance $C_{OSS}$ is given as:

$$Q_{OSS} = \int_{V=0}^{VBR} C_{OSS} dV \tag{1}$$

where VBR is the breakthrough voltage of the MOSFET, and $C_{OSS}$ is the output capacitance that is given by the gate-drain capacitance $C_{GD}$ and the drain-source capacitance $C_{DS}$. These parameters ($Q_{OSS}$, $Q_{RR}$, $R_{ON}$) are commonly known and are, for example, described in Görgens, Lutz; Siemieniec, Ralf; Sanchez, Juan Miguel Martinez, "MOSFET Technology as a Key for High Power Density Converters," Power Electronics and Motion Control Conference, 2006. EPE-PEMC 2006. 12th International, pp. 1968-1973, Aug. 30, 2006-Sep. 1, 2006. Usually, a low on-resistance $R_{ON}$ results in a high bipolar charge $Q_{RR}$ and a high output charge, and a high voltage blocking capability $V_{BR}$ results in a high on-resistance $R_{ON}$. Thus. The performance of a MOSFET can, therefore, be expressed by a figure of merit (FOM) that takes into account the product $R_{ON} \times (Q_{RR}+Q_{OSS})$, and the reciprocal ($1/V_{BR}$) of the voltage blocking capability.

Each of the semiconductor arrangements explained herein before that can be used as a synchronous rectifier has an on-resistance $R_{ON}$ corresponding to an on-resistance of a MOSFET, an output charge $Q_{OSS}$ corresponding to the output charge of a MOSFET, a bipolar charge $Q_{RR}$ corresponding to the bipolar charge of a MOSFET, and a voltage blocking capability, so that these semiconductor arrangements can be characterized by the same FOM. Compared with a conventional MOSFET, a semiconductor arrangement with the first semiconductor device 2 (such as a diode or a MOSFET), and with the plurality of second semiconductor devices $3_1$-$3_n$ can be implemented with a lower on-resistance $R_{ON}$ at a given voltage blocking capability $V_{BR}$ as compared with a conventional MOSFET. A suitable $FOM_{SR}$ to characterize the semiconductor arrangements explained before is, for example, $$FOM_{SR} = \frac{R_{ON}[mOhm] \cdot (Q_{RR} \cdot Q_{OSS})[nC]}{(V_{BR})^{1.5}}. \tag{2}$$

According to one embodiment, each of the semiconductor arrangements explained before with one first semiconductor device 2 and a plurality of second semiconductor devices $3_1$-$3_n$ can be implemented so that $FOM_{SR}$ is below 3, below 2, below 1.5, below 1.2, or even below 1.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A circuit arrangement comprising a rectifier circuit, the rectifier circuit comprising:
    a first and a second load terminal;
    a first semiconductor device having a load path and a control terminal;
    a plurality of second semiconductor devices each having a load path between a first load terminal and a second load terminal and a control terminal;
    wherein the load paths of the second semiconductor devices are connected in series, and connected in series to the load path of the first semiconductor device, and wherein a series circuit with the first semiconductor device and the second semiconductor devices is connected between the load terminals of the rectifier circuit, and
    wherein the control terminal of one of the second semiconductor devices is connected to one of the load terminals of the first semiconductor device, and wherein the control terminal of each of the second semiconductor devices other than the one second semiconductor device is connected to a load terminal of one second semiconductor device.

2. The circuit arrangement of claim 1, wherein the first semiconductor device is a transistor of a first conduction type.

3. The circuit arrangement of claim 2, wherein each of the second semiconductor devices is a transistor of a second conduction type complementary to the first conduction type.

4. The circuit arrangement of claim 3,
    wherein the transistor of the first conduction type is a MOSFET; and
    wherein the transistor of the second conduction type is selected from the group consisting of:
    a depletion MOSFET, HEMT, nanotube; or
    a JFET;
    a HEMT; and
    a nanotube.

5. The circuit arrangement of claim 4, wherein the transistor of the first conduction type has a threshold voltage of substantially 0V.

6. The circuit arrangement of claim 1, wherein the first semiconductor device is configured to receive a load-path voltage of at least one of the plurality of second semiconductor devices as a drive voltage.

7. The circuit arrangement of claim 1, further comprising:
    a resistor connected in series with the first semiconductor device, and connected between the first semiconductor device and the plurality of second semiconductor devices.

8. The circuit arrangement of claim 2, further comprising:
    a further transistor connected in series with the first semiconductor device, and connected between the first semiconductor device and the plurality of second semiconductor devices.

9. The circuit arrangement of claim 8,
    wherein the further transistor is configured to receive a load-path voltage of the first semiconductor device as a drive voltage, and
    wherein the first semiconductor device is configured to receive the load-path voltage of at least the further transistor as a drive voltage.

10. The circuit arrangement of claim 1, further comprising:
    a voltage divider circuit connected between the first load terminal and the second load terminal and configured to drive the first semiconductor device.

11. The circuit arrangement of claim 10, wherein the voltage divider circuit comprises:
    a rectifier element; and
    a plurality of third semiconductor devices connected in series with the rectifier element, wherein each of the third semiconductor devices is configured to receive a load-path voltage of at least one of the third semiconductor devices or the rectifier element as a drive voltage.

12. The circuit arrangement of claim 11, wherein the third semiconductor devices are selected from the group consisting of:
    a depletion MOSFET;
    an enhancement MOSFET;
    a HEMT;
    a nanotube; and
    a JFET.

13. The circuit arrangement of claim 1, wherein the circuit arrangement is a power converter circuit with a topology selected from the group consisting of:
    a buck converter topology;
    a boost converter topology;
    a flyback converter topology;
    a TTF topology; a phase-shift ZVS topology; and
    an LLC resonant converter topology.

14. A rectifier circuit, comprising:
    a first and a second load terminal;
    a first semiconductor device having a load path and configured to receive a drive signal; and
    a plurality of second semiconductor devices each having a load path and each configured to receive a drive signal, wherein the load paths of the second semiconductor devices are connected in series, and connected in series to the load path of the first semiconductor device, and wherein a series circuit with the first semiconductor device and the second semiconductor devices is connected between the load terminals, wherein each of the second semiconductor devices is configured to receive as a drive voltage either a load-path voltage of at least one of the second semiconductor devices, or a load-path of at least the first semiconductor device, and wherein the first semiconductor device is configured to receive as a drive voltage a load-path-voltage of at least one of the second semiconductor devices.

15. The rectifier circuit of claim 14, wherein the first semiconductor device is a transistor of a first conduction type.

16. The circuit arrangement of claim 15, wherein each of the second semiconductor devices is a transistor of a second conduction type complementary to the first conduction type.

17. The rectifier circuit of claim 16,
wherein the transistor of the first conduction type is a MOSFET; and
wherein the transistor of the second conduction type is selected from the group consisting of:
a depletion MOSFET;
a HEMT;
a nanotube; and
a JFET.

18. The rectifier circuit of claim 17, wherein the transistor of the first conduction type has a threshold voltage of substantially 0V.

19. The rectifier circuit of claim 14, wherein the first semiconductor device is configured to receive a load-path voltage of at least one of the plurality of second semiconductor devices as a drive voltage.

20. The rectifier circuit of claim 14, further comprising:
a resistor connected in series with the first semiconductor device and connected between the first semiconductor device and the plurality of second semiconductor devices.

21. The rectifier circuit of claim 15, further comprising:
a further transistor connected in series with the first semiconductor device and connected between the first semiconductor device and the plurality of second semiconductor devices.

22. The rectifier circuit of claim 21,
wherein the further transistor is configured to receive a load-path voltage of the first semiconductor device as a drive voltage, and
wherein the first semiconductor device is configured to receive the load-path voltage of at least the further transistor as a drive voltage.

23. The rectifier circuit of claim 14, further comprising:
a voltage divider circuit connected between the first load terminal and the second load terminal and configured to drive the first semiconductor device.

24. The rectifier circuit of claim 14, wherein the voltage divider circuit comprises:
a rectifier element; and
a plurality of third semiconductor devices connected in series with the rectifier element, wherein each of the third semiconductor devices is configured to receive a load-path voltage of at least one of the third semiconductor devices or the rectifier element as a drive voltage.

25. The rectifier circuit of claim 24, wherein the third semiconductor devices are selected from the group consisting of:
a depletion MOSFET;
an enhancement MOSFET;
a HEMT;
a nanotube; and
a JFET.

26. The rectifier circuit of claim 14, wherein $FOM_{SR}$ is below 3, wherein $$FOM_{SR} = \frac{R_{ON}[mOhm] \cdot (Q_{RR} \cdot Q_{OSS})[nC]}{(V_{BR})^{1.5}}$$

where $R_{ON}$ is the on-resistance, $Q_{RR}$ is the bipolar charge, $Q_{OSS}$ is the output charge, and $V_{BR}$ is the voltage blocking capability.

* * * * *